US012772869B2

(12) United States Patent
Iso

(10) Patent No.: US 12,772,869 B2
(45) Date of Patent: Oct. 20, 2026

(54) SEMICONDUCTOR MODULE HAVING HEAT DISSIPATION BASE SURROUNDED BY ELASTIC MEMBER, POWER CONVERTER CONTAINING THE SAME, AND POWER CONVERTER MANUFACTURING METHOD THEREFOR

(71) Applicant: FUJI ELECTRIC CO., LTD., Kawasaki (JP)

(72) Inventor: Akira Iso, Kai-city (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 576 days.

(21) Appl. No.: 18/359,098

(22) Filed: Jul. 26, 2023

(65) Prior Publication Data

US 2024/0071876 A1 Feb. 29, 2024

(30) Foreign Application Priority Data

Aug. 26, 2022 (JP) ................................ 2022-135375

(51) Int. Cl.
*H10W 70/40* (2026.01)
*H10W 70/60* (2026.01)
(Continued)

(52) U.S. Cl.
CPC ....... *H10W 70/461* (2026.01); *H10W 70/465* (2026.01); *H10W 70/468* (2026.01);
(Continued)

(58) Field of Classification Search
CPC .... H05K 7/209; H10W 74/00; H10W 70/611; H10W 70/635; H10W 72/50;
(Continued)

(56) References Cited

U.S. PATENT DOCUMENTS 6,665,186 B1 12/2003 Calmidi et al.
11,997,837 B2 * 5/2024 Nishiyama ......... H05K 7/20454
(Continued)

FOREIGN PATENT DOCUMENTS

CN 216054668 U 3/2022
CN 114501961 A 5/2022
(Continued)

OTHER PUBLICATIONS

Yoshitaka Nishimura et al., "Thermal Management Technology for IGBT Modules," Fuji Electric Journal, vol. 82, No. 6, Nov. 2009, pp. 67-71; with English abstract.
(Continued)

*Primary Examiner* — Alonzo Chambliss
(74) *Attorney, Agent, or Firm* — Rabin & Berdo, P.C.

(57) ABSTRACT

A semiconductor module includes an insulated circuit substrate including a semiconductor chip, an insulated circuit substrate including a wiring board provided on a front surface thereof, the wiring board having the semiconductor chip bonded thereto, a heat dissipation base having a front surface and a rear surface opposite to each other. The front surface has a substrate region to which the insulated circuit substrate is bonded. The rear surface has a heat dissipation region positioned overlapping the substrate region in a plan view of the semiconductor module and a loop-shaped region surrounding the heat dissipation region. The semiconductor module further includes a solid heat dissipation member made of a phase change material and provided on the rear surface of the heat dissipation base in the heat dissipation region, and an elastic member provided on the rear surface of the heat dissipation base in the loop-shaped region.

12 Claims, 17 Drawing Sheets

(51) Int. Cl.
*H10W 76/15* (2026.01)
*H10W 90/00* (2026.01)

(52) U.S. Cl.
CPC .......... *H10W 70/611* (2026.01); *H10W 76/15* (2026.01); *H10W 90/00* (2026.01); *H10W 90/811* (2026.01); *H10W 90/754* (2026.01); *H10W 90/763* (2026.01); *H10W 90/765* (2026.01)

(58) Field of Classification Search
CPC . H10W 70/461; H10W 70/465; H10W 90/00; H10W 90/811; H10W 40/611; H10W 70/468; H10W 70/60; H10W 40/255; H10W 90/765; H10W 76/15
See application file for complete search history.

(56) References Cited

U.S. PATENT DOCUMENTS

| | | | | |
|---|---|---|---|---|
| 2010/0065962 | A1* | 3/2010 | Bayerer | H10W 40/255 257/E23.009 |
| 2010/0252922 | A1* | 10/2010 | Bayerer | H10W 72/00 156/60 |
| 2013/0134572 | A1* | 5/2013 | Lenniger | H10W 40/22 438/122 |
| 2015/0357262 | A1 | 12/2015 | Yoneyama et al. | |
| 2020/0194329 | A1 | 6/2020 | Itoh | |
| 2022/0141988 | A1 | 5/2022 | Nishiyama et al. | |

FOREIGN PATENT DOCUMENTS

| | | | |
|---|---|---|---|
| JP | 2004146819 | A | 5/2004 |
| JP | 2006-332479 | A | 12/2006 |
| JP | 2009-277976 | A | 11/2009 |
| JP | 2013-251473 | A | 12/2013 |
| JP | 2015230949 | A | 12/2015 |
| JP | 2022-073478 | A | 5/2022 |
| WO | 2019181198 | A1 | 9/2019 |
| WO | 2019/239997 | A1 | 12/2019 |

OTHER PUBLICATIONS

Office Action issued for corresponding Japanese Patent Application No. 2022-135375, and its English translation, dated Jun. 16, 2026.

* cited by examiner

SEMICONDUCTOR MODULE HAVING HEAT DISSIPATION BASE SURROUNDED BY ELASTIC MEMBER, POWER CONVERTER CONTAINING THE SAME, AND POWER CONVERTER MANUFACTURING METHOD THEREFOR

CROSS-REFERENCE TO RELATED APPLICATION

This application is based upon and claims the benefit of priority of the prior Japanese Patent Application No. 2022-135375, filed on Aug. 26, 2022, the entire contents of which are incorporated herein by reference.

BACKGROUND OF THE INVENTION

1. Field of the Invention

The embodiments discussed herein relate to a semiconductor module, a power converter, and a power converter manufacturing method.

2. Background of the Related Art

A semiconductor module includes power devices, and for example, forms an inverter. Such a semiconductor module is used in a power converter. Examples of the power devices include insulated gate bipolar transistors (IGBTs) and power metal-oxide-semiconductor field-effect transistors (MOSFETs). The semiconductor module is constituted by laminating semiconductor chips including power devices, an insulated circuit substrate, and a heat dissipation base.

In the semiconductor module used in the power converter, a cooling module is provided on the rear surface of the heat dissipation base via a thermal grease. Examples of the cooling module include a cooling fin and a cooing device using a coolant. The heat dissipation base of the semiconductor module and the cooling module are joined to each other by screws.

The semiconductor module in which the thermal grease is applied to the heat dissipation base in advance may be shipped, and the cooling module may be attached to the semiconductor module at the shipping destination. In this case, if the thermal grease is in a paste form, the thermal grease may make its surroundings dirty during the shipment. To avoid this, a phase change thermal grease is used instead of such a thermal grease. The phase change thermal grease keeps its solid state at room temperature and, when heated, changes into a paste.

See, for example, the following documents.

Japanese Laid-open Patent Publication No. 2006-332479.

Japanese Laid-open Patent Publication No. 2013-251473.

International Publication Pamphlet No. WO 2019/239997.

Japanese Laid-open Patent Publication No. 2022-073478.

Japanese Laid-open Patent Publication No. 2009-277976.

"Fuji Electric Journal," Vol. 82, No. 6, 2009, pages 67-71.

At the shipping destination of the semiconductor module that is provided in the above-mentioned power converter, the cooling module is joined to the semiconductor module by screws, and then the phase change thermal grease is changed into a paste. According to the phase change of the phase change thermal grease from solid to liquid, the gap between the heat dissipation base and the cooling module becomes smaller. Therefore, a gap may be generated between the heat dissipation base and each screw, which may reduce the tightening torque between the semiconductor module and the cooling module.

SUMMARY OF THE INVENTION

According to one aspect, there is provided a semiconductor module, including: a semiconductor chip; an insulated circuit substrate including a wiring board on a front surface thereof, the wiring board having the semiconductor chip bonded thereto; a heat dissipation base having a front surface and a rear surface opposite to each other, the front surface having a substrate region to which the insulated circuit substrate is bonded, the rear surface having a heat dissipation region overlapping the substrate region in a plan view of the semiconductor module and a loop-shaped region surrounding the heat dissipation region, the heat dissipation base having a plurality of fastening holes through which fastening members are to be inserted, the fastening holes being located outside the substrate region and being surrounded by the loop-shaped region; a solid heat dissipation member made of a phase change material, provided on the rear surface of the heat dissipation base in the heat dissipation region; and an elastic member on the rear surface of the heat dissipation base in the loop-shaped region.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, embodiments will be described with reference to the accompanying drawings. In the following description, the terms "front surface" and "upper surface" refer to an X-Y surface facing up (in the +Z direction) in a semiconductor module 10 of drawings. Similarly, the term "up" refers to an upward direction (the +Z direction) in the semiconductor module 10 of the drawings. The terms "rear surface" and "lower surface" refer to an X-Y surface facing down (in the −Z direction) in the semiconductor module 10 of the drawings. Similarly, the term "down" refers to a downward direction (the −Z direction) in the semiconductor module 10 of the drawings. The same directionality applies to other drawings, as appropriate. The terms "front surface," "upper surface," "up," "rear surface," "lower surface," "down," and "side surface" are used for convenience to describe relative positional relationships, and do not limit the technical ideas of the embodiment. For example, the terms "up" and "down" are not always related to the vertical directions to the ground. That is, the "up" and "down" directions are not limited to the gravity direction. In addition, in the following description, the term "main component" refers to a component contained at a volume ratio of 80 vol % or more.

First Embodiment

Figure 1:
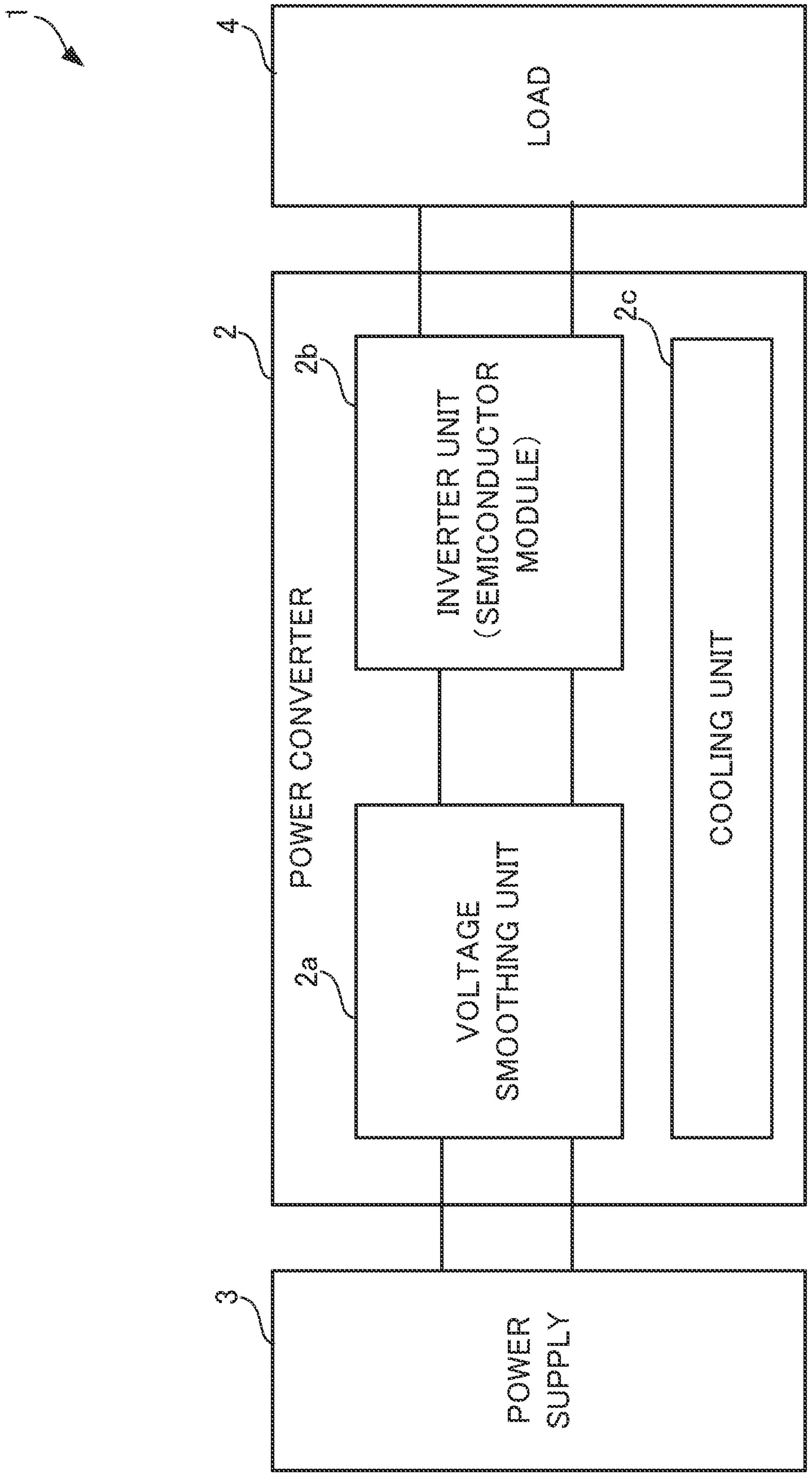
FIG. 1 illustrates the basic configuration of a power conversion system according to a first embodiment.

The basic configuration of a power conversion system will be described with reference to FIG. 1. FIG. 1 illustrates the basic configuration of a power conversion system according to a first embodiment. The power conversion system 1 includes a power converter 2, a power supply 3, and a load 4.

The power converter 2 converts direct current power supplied from the power supply 3 to alternating current power that is then supplied to the load 4. This power converter 2 includes a voltage smoothing unit 2*a*, an inverter unit 2*b*, and a cooling unit 2*c*. The voltage smoothing unit 2*a* smooths a direct current voltage supplied from the power supply 3. The voltage smoothing unit 2*a* may include a smoothing circuit that has this function. The inverter unit 2*b* converts the direct current voltage smoothed by the voltage smoothing unit 2*a* to an alternating current voltage that is then applied to the load 4. The inverter unit 2*b* may include an inverter circuit that has this function. The inverter unit 2*b* includes a semiconductor module 10, which will be described later. In addition to this, the inverter unit 2*b* includes a control driving circuit that controls the semiconductor module 10, and others. In this connection, the load 4 is a motor, for example. The cooling unit 2*c* cools the voltage smoothing unit 2*a* and the inverter unit 2*b*. For example, the cooling unit 2*c* is a cooling fin or a cooling device that achieves the cooling through circulation of a coolant therein. The cooling unit 2*c* corresponds to a cooling module 90, which will be described later.

Figure 2:
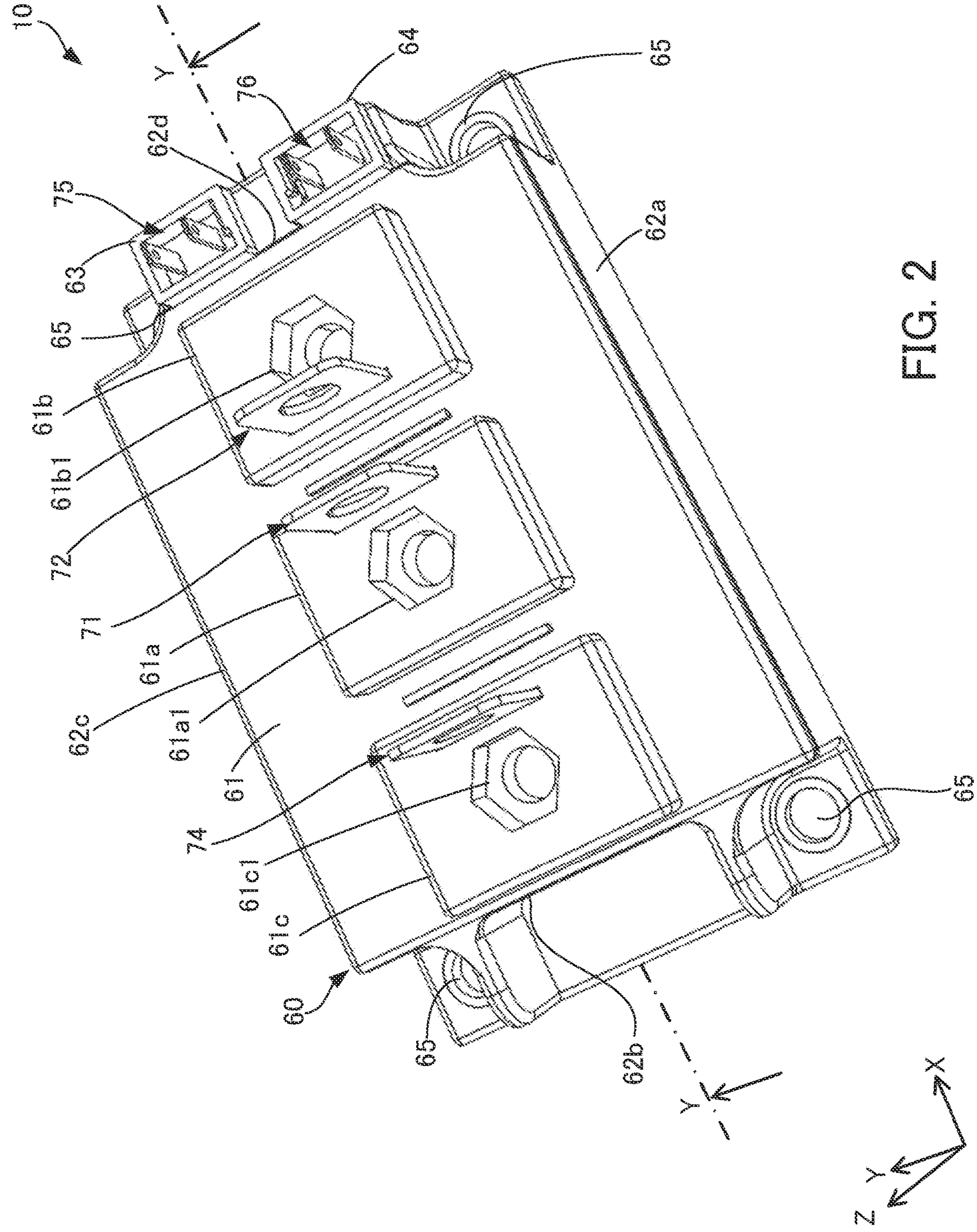
FIG. 2 is an appearance view of a semiconductor module according to the first embodiment.

The following describes the semiconductor module 10 of the inverter unit 2*b* provided in the power converter 2 with reference to FIG. 2. FIG. 2 is an appearance view of a semiconductor module according to the first embodiment. Components, which will be described later, of the semiconductor module 10 are housed in a case 60, as illustrated in FIG. 2. In this connection, a heat dissipation base 30, which is rectangular in plan view, is provided on the rear surface (on the rear surface side of the case 60) of the semiconductor module 10 (see FIGS. 3 and 4).

The case 60 includes a lid 61, sidewalls 62*a* to 62*d*, and terminal ports 63 and 64. The lid 61 has terminal blocks 61*a*, 61*b*, and 61*c* arranged at the center thereof in the long-side direction thereof. Screw holes 61*a*1, 61*b*1, and 61*c*1 are respectively formed in the front surfaces of the terminal blocks 61*a*, 61*b*, and 61*c*. First to third wiring members 71, 72, and 74 extend upward from the terminal blocks 61*a*, 61*b*, and 61*c*, respectively. FIG. 2 illustrates the case where the first to third wiring members 71, 72, and 74 extend upward (in the +Z direction). The extending first to third wiring members 71, 72, and 74 are bent toward the front surfaces of the terminal blocks 61*a*, 61*b*, and 61*c*, respectively, so that opening holes formed in the first to third wiring members 71, 72, and 74 face the screw holes 61*a*1, 61*b*1, and 61*c*1, respectively, and screws are tightened into the opening holes and the corresponding screw holes 61*a*1, 61*b*1, and 61*c*1 together. In addition, the case 60 surrounds fastening holes 31*a* to 31*d* formed in the heat dissipation base 30, and has fixing holes 65 at the four corners thereof in plan view so that the fixing holes 65 face the fastening holes 31*a* to 31*d*, respectively.

The sidewalls 62*a* to 62*d* surround in order the four sides of the heat dissipation base 30. The sidewalls 62*a* to 62*d* surround the components disposed on the heat dissipation base 30 (see FIG. 3). In this connection, the sidewalls 62*a* to 62*d* are firmly attached to the heat dissipation base 30 using an adhesive. The terminal ports 63 and 64 are provided in the sidewall 62*d*. Control terminals 75 and 76 are exposed from the terminal ports 63 and 64, respectively. In this connection, the fixing holes 65 are formed in the vicinity of the corners each defined by two of the sidewalls 62*a* to 62*d*. The semiconductor module 10 may be screwed to a cooling module, which will be described later, through the fixing holes 65.

The sidewalls 62*a* to 62*d*, terminal ports 63 and 64, and fixing holes 65 included in the case 60 are integrally molded using a resin. In addition, the lid 61 is also integrally molded using the resin. The resin here contains a thermoplastic resin as a main component. Examples of the thermoplastic resin include a polyphenylene sulfide resin, a polybutylene terephthalate resin, a polybutylene succinate resin, a polyamide resin, and an acrylonitrile butadiene styrene resin. The case 60 may be formed by attaching the lid 61 that is separately made to the opening formed by the sidewalls 62*a* to 62*d* using an adhesive.

Figure 3:
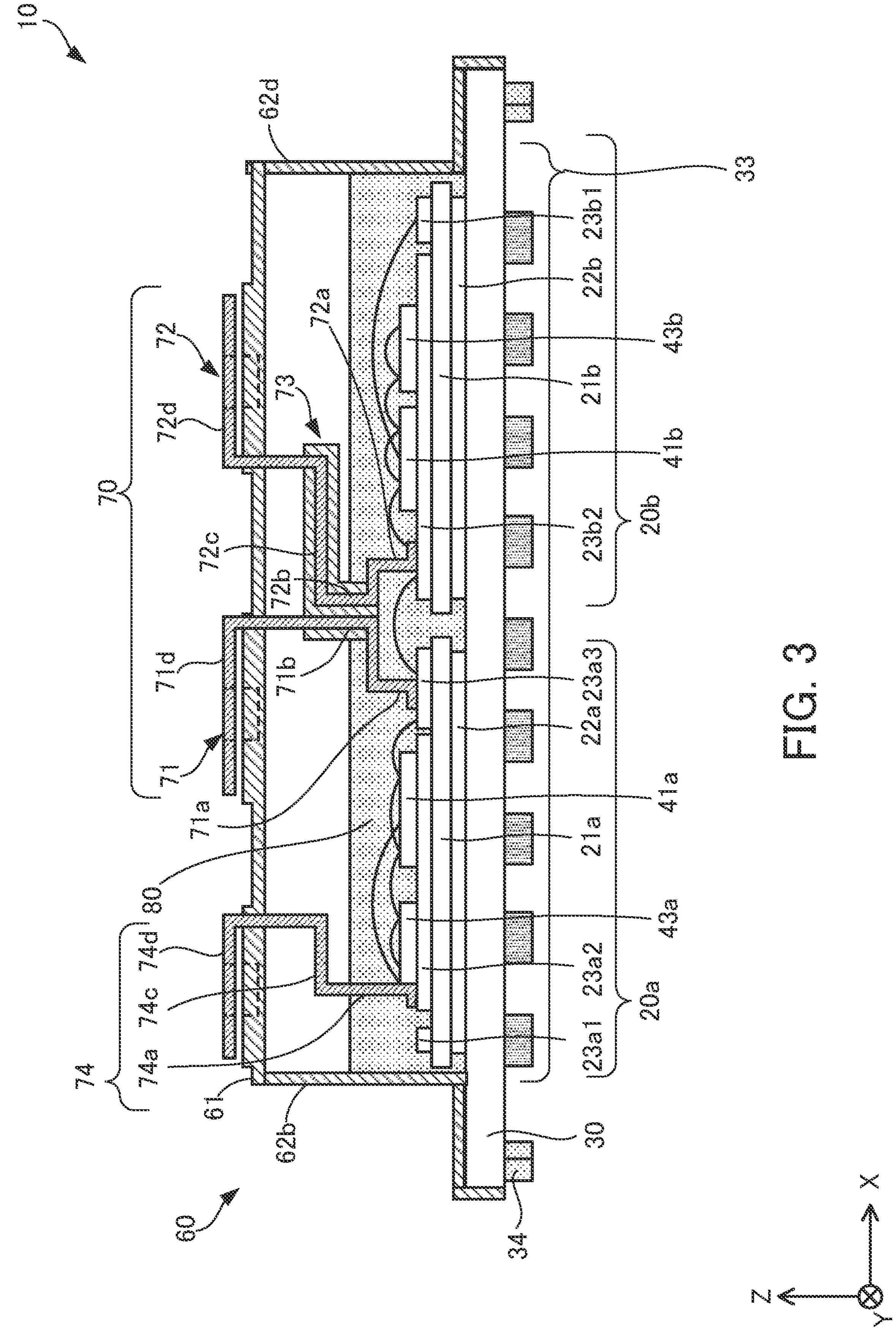
FIG. 3 is a sectional view of the semiconductor module according to the first embodiment.
Figure 4:
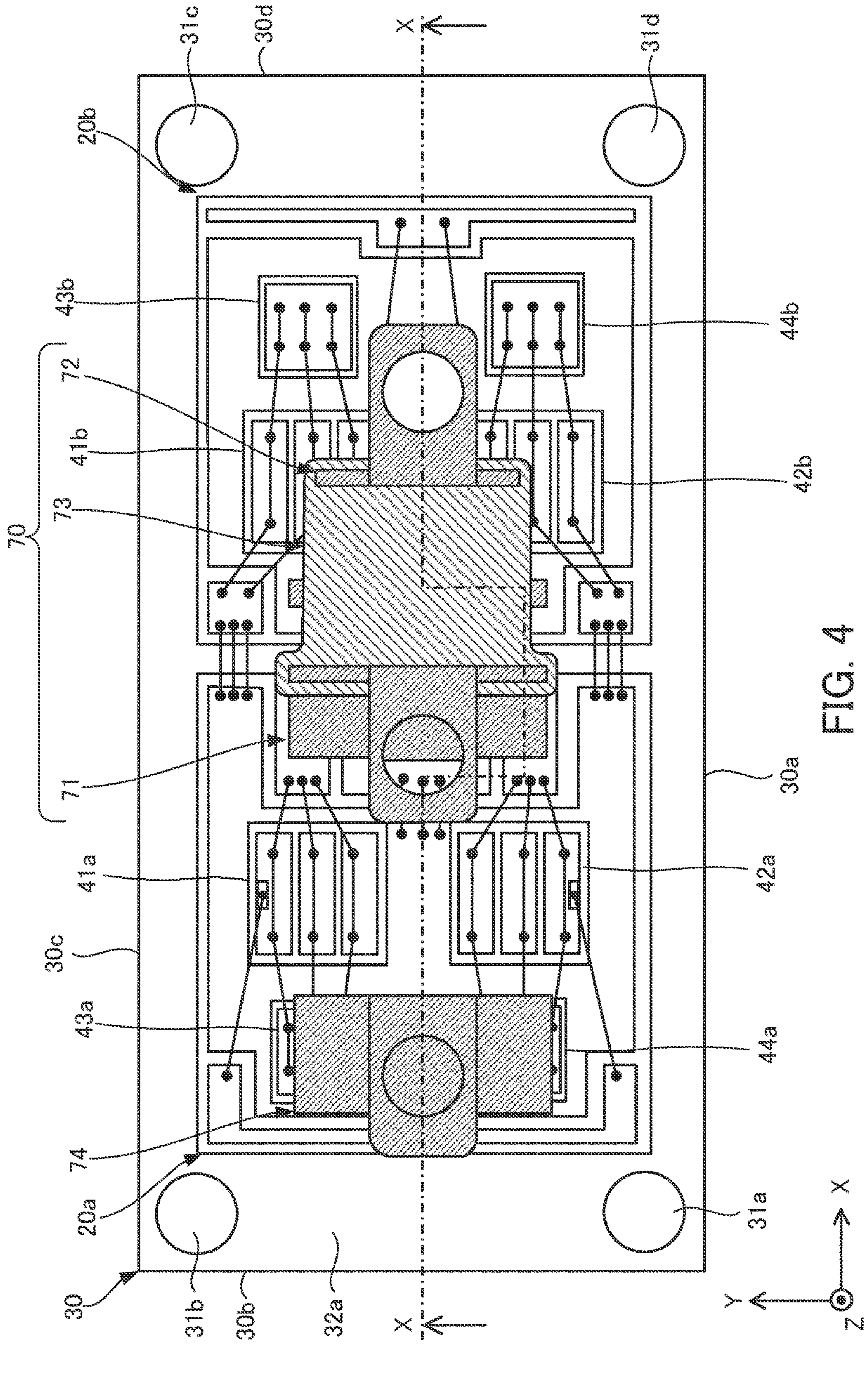
FIG. 4 is a plan view (without a case) of the semiconductor module according to the first embodiment.
Figure 5:
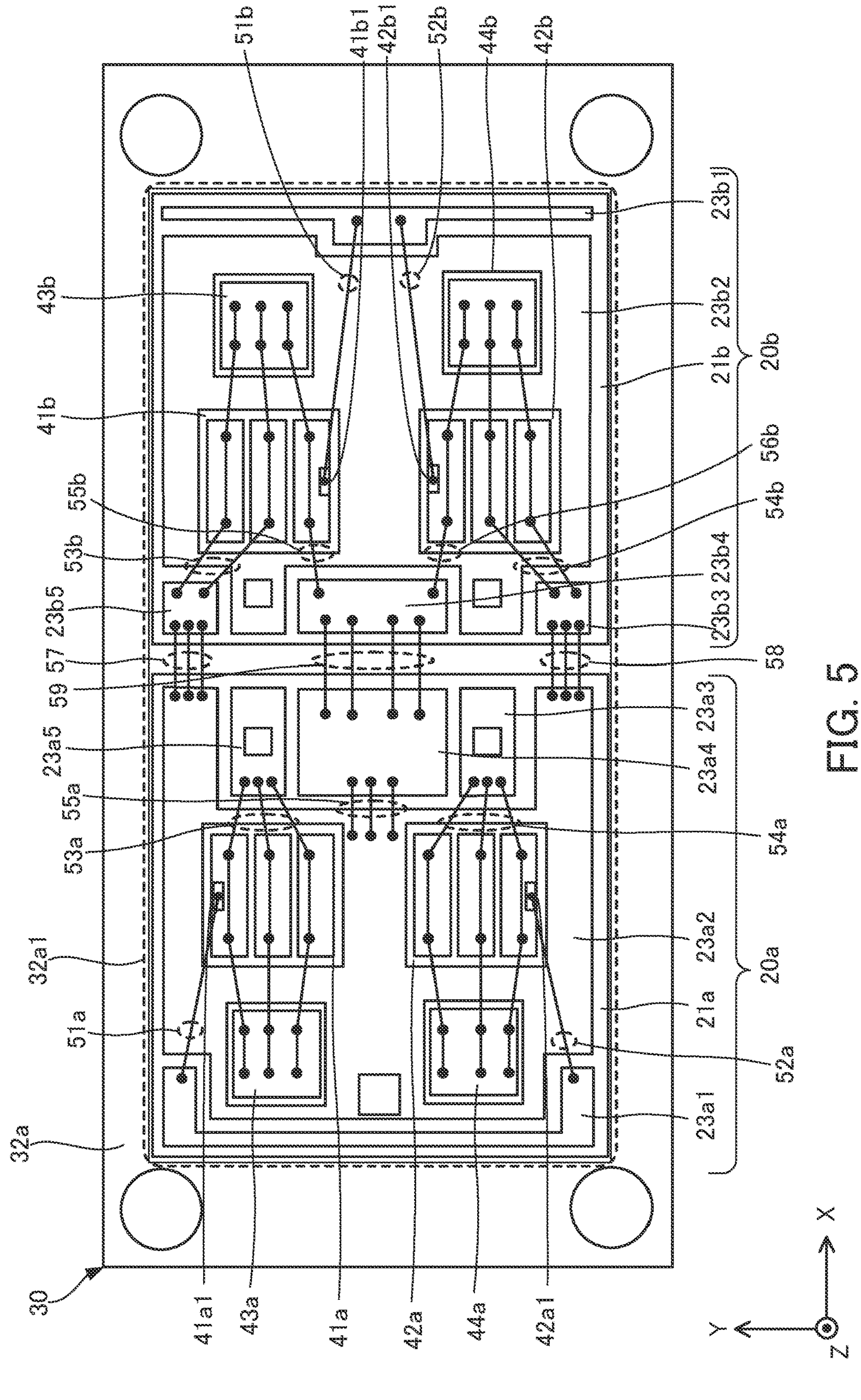
FIG. 5 is a plan view (without a case or terminals) of the semiconductor module according to the first embodiment.
Figure 6:
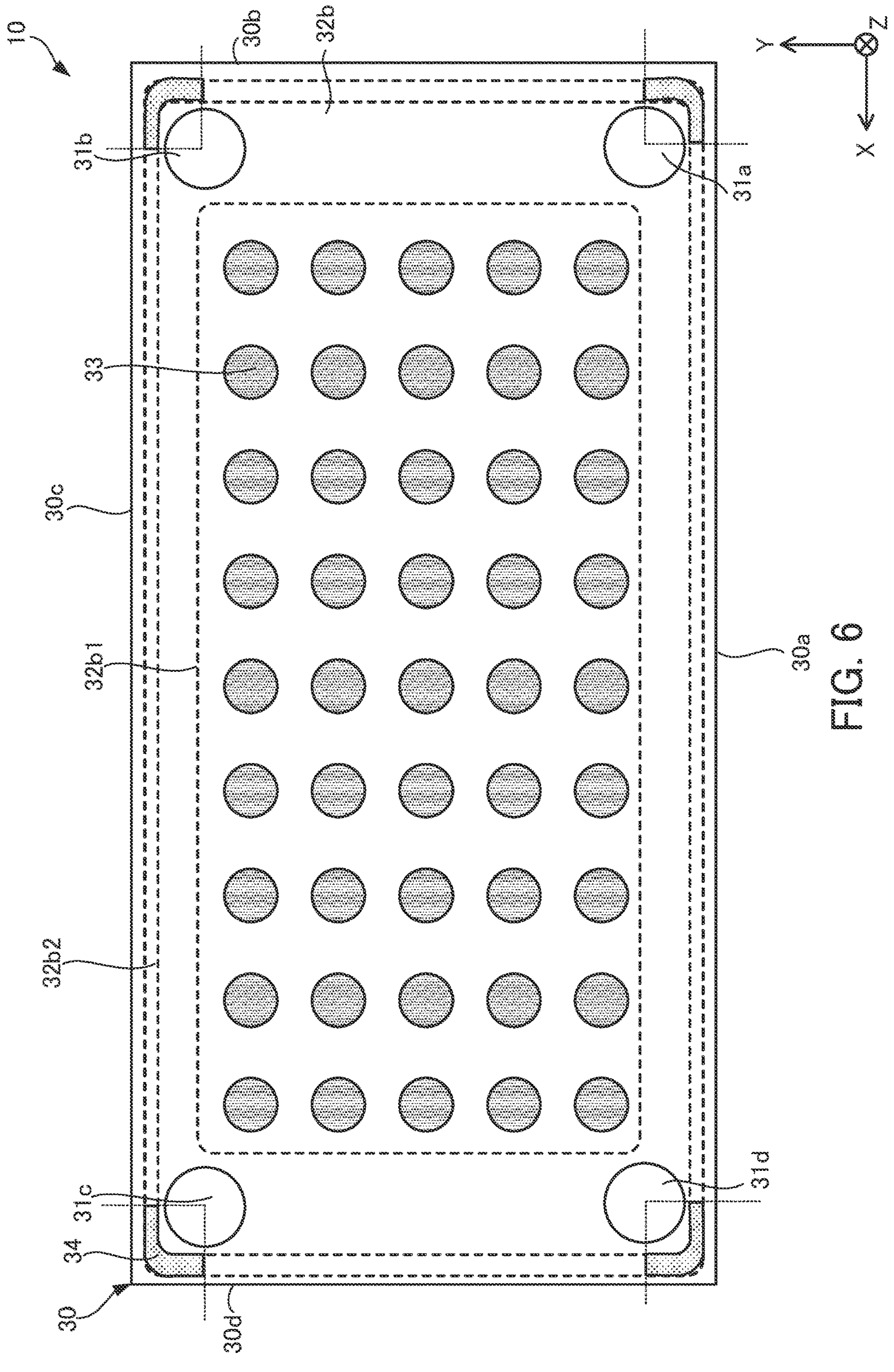
FIG. 6 is a rear surface view of the semiconductor module according to the first embodiment.

The following describes the components housed in the semiconductor module 10 with reference to FIGS. 3 to 6. FIG. 3 is a sectional view of the semiconductor module according to the first embodiment. FIG. 4 is a plan view (without a case) of the semiconductor module according to the first embodiment. FIG. 5 is a plan view (without a case or terminals) of the semiconductor module according to the first embodiment. FIG. 6 is a rear surface view of the semiconductor module according to the first embodiment. In this connection, FIG. 3 is a sectional view taken along a dash-dotted line Y-Y of FIG. 2. FIG. 4 is a plan view of the semiconductor module 10 of FIG. 2 without the case 60.

FIG. 5 is a plan view of the semiconductor module 10 of FIG. 2 without the case 60 or the first to third wiring members 71, 72, and 74.

As illustrated in FIGS. 3 to 5, the semiconductor module 10 includes insulated circuit substrates 20*a* and 20*b* and the heat dissipation base 30 having the insulated circuit substrates 20*a* and 20*b* disposed on the front surface thereof. In the semiconductor module 10, these components are housed in the case 60. Semiconductor chips 41*a* to 44*a* and 41*b* to 44*b* are disposed on the insulated circuit substrates 20*a* and 20*b*, respectively. In addition, the semiconductor module 10 includes the first to third wiring members 71, 72, and 74. For example, the first to third wiring members 71, 72, and 74 are plate-like lead frames.

The case 60 is provided on the periphery of the heat dissipation base 30. This case 60 has the sidewalls 62*a* to 62*d* that surround the insulated circuit substrates 20*a* and 20*b*, and the lid 61 provided at the top of the opening formed by the sidewalls 62*a* to 62*d*. The semiconductor chips 41*a* to 44*a* and 41*b* to 44*b*, insulated circuit substrates 20*a* and 20*b* (and bonding wires 51*a* to 55*a*, 51*b* to 56*b*, and 57 to 59) are housed in the space surrounded by the case 60 and heat dissipation base 30. In addition, the semiconductor chips 41*a* to 44*a* and 41*b* to 44*b*, insulated circuit substrates 20*a* and 20*b* (and bonding wires 51*a* to 55*a*, 51*b* to 56*b*, and 57 to 59) may be sealed by a sealing member 80. The sealing member 80 is silicone, for example. In addition, end portions of the first to third wiring members 71, 72, and 74 for electrical connection with an external device are exposed on the lid 61. In this connection, the illustration of the control terminals 75 and 76 illustrated in FIG. 2 is omitted in FIGS. 3 to 5.

One end portion of each of the first to third wiring members 71, 72, and 74 is connected to the insulated circuit substrate 20*a* or the insulated circuit substrate 20*b* inside the case 60. In addition, the other end portion thereof extends to the outside from the lid 61. The other end portion may be connected to the power supply 3 or load 4, not illustrated.

More specifically, the one end portion of the first wiring member 71 is electrically and mechanically connected to the wiring boards 23*a*3 and 23*a*5 of the insulated circuit substrate 20*a*. The one end portion of the first wiring member 71 is electrically connected to the semiconductor chips 41*a*, 42*a*, 43*a*, and 44*a* via the wiring boards 23*a*3 and 23*a*5 and the bonding wires 53*a* and 54*a*. The other end portion (first external connection portion 71*d*) of the first wiring member 71 extends to the outside from the lid 61 and is bent toward the front surface of the lid 61.

The one end portion of the second wiring member 72 is electrically and mechanically connected to the wiring board 23*b*2 of the insulated circuit substrate 20*b*. The one end portion of the second wiring member 72 is electrically connected to the semiconductor chips 41*b*, 42*b*, 43*b*, and 44*b* via the wiring board 23*b*2. The other end portion (second external connection portion 72*d*) of the second wiring member 72 extends to the outside from the lid 61 and is bent toward the front surface of the lid 61.

The one end portion of the third wiring member 74 is electrically and mechanically connected to the wiring board 23*a*2 of the insulated circuit substrate 20*a*. The one end portion of the third wiring member 74 is electrically connected to the semiconductor chips 41*a*, 42*a*, 43*a*, and 44*a* via the wiring board 23*a*2. The other end portion (third external connection portion 74*d*) of the third wiring member 74 extends to the outside from the lid 61 and is bent toward the front surface of the lid 61.

A wiring unit 70 includes the above-described first and second wiring members 71 and 72 and a wiring holding unit 73. In the wiring unit 70, parts of the first and second wiring members 71 and 72 are integrally formed with the wiring holding unit 73. Note that the wiring holding unit 73 enables the first and second wiring members 71 and 72 to keep insulation therebetween.

The insulated circuit substrates 20*a* and 20*b* include insulating plates 21*a* and 21*b*, metal plates 22*a* and 22*b* formed on the rear surfaces of the insulating plates 21*a* and 21*b*, and wiring boards 23*a*1 to 23*a*5 and 23*b*1 to 23*b*5 formed on the front surfaces of the insulating plates 21*a* and 21*b*, respectively. In this connection, the insulating plates 21*a* and 21*b* and metal plates 22*a* and 22*b* are rectangular in plan view. In addition, the corners of the insulating plates 21*a* and 21*b* and metal plates 22*a* and 22*b* may be rounded or chamfered. In plan view, the metal plates 22*a* and 22*b* are smaller in size than the insulating plates 21*a* and 21*b* and are formed inside the insulating plates 21*a* and 21*b*, respectively.

The insulating plates 21*a* and 21*b* are made of a ceramic material with high thermal conductivity as a main component. The ceramic material contains aluminum oxide, aluminum nitride, or silicon nitride as a main component, for example.

The metal plates 22*a* and 22*b* are made of a metal with high thermal conductivity as a main component. Examples of the metal here include copper, aluminum, and an alloy containing at least one of these. Plating may be performed on the surfaces of the metal plates to improve their corrosion resistance. Examples of the plating material used here include nickel, a nickel-phosphorus alloy, and a nickel-boron alloy.

The wiring boards 23*a*1 to 23*a*5 and 23*b*1 to 23*b*5 are made of a metal with high electrical conductivity as a main component. Examples of the metal here include copper, aluminum, and an alloy containing at least one of these. Plating may be performed on the surfaces of the wiring boards 23*a*1 to 23*a*5 and 23*b*1 to 23*b*5 to improve their corrosion resistance. Examples of the plating material used here include nickel, a nickel-phosphorus alloy, and a nickel-boron alloy.

For example, the above-described wiring boards 23*a*1 to 23*a*5 and 23*b*1 to 23*b*5 are obtained by forming a metal layer on each front surface of the insulating plates 21*a* and 21*b* and performing etching or the like on the metal layer. Alternatively, the wiring boards 23*a*1 to 23*a*5 and 23*b*1 to 23*b*5 cut out of a metal layer in advance may be press-bonded to the front surfaces of the insulating plates 21*a* and 21*b*. In this connection, the shapes and quantity of the wiring boards 23*a*1 to 23*a*5 and 23*b*1 to 23*b*5 illustrated in FIGS. 3 to 5 are just an example.

As the insulated circuit substrates 20*a* and 20*b* configured as above, direct copper bonding (DCB) substrates and active metal brazed (AMB) substrates may be used, for example. The insulated circuit substrates 20*a* and 20*b* are able to conduct heat generated by the semiconductor chips 41*a* to 44*a* and 41*b* to 44*b* through the wiring boards 23*a*2 and 23*b*2, insulating plates 21*a* and 21*b*, and metal plates 22*a* and 22*b* to the outside.

In addition, the one end portion (first leg portion 71*a* (see FIG. 3)) of the first wiring member 71 is connected to the wiring boards 23*a*3 and 23*a*5 of the insulated circuit substrate 20*a* via a solder (not illustrated). The one end portion (second leg portion 72*a* (see FIG. 3)) of the second wiring member 72 is connected to the wiring board 23*b*2 of the insulated circuit substrate 20*b* via the solder (not illustrated).

The one end portion (third leg portion 74*a* (see FIG. 3)) of the third wiring member 74 is connected to the wiring board 23*a*2 of the insulated circuit substrate 20*a* via the solder (not illustrated). The solder may be a lead-free solder. For example, the lead-free solder contains, as a main component, at least any one of a tin-silver-copper alloy, a tin-zinc-bismuth alloy, a tin-copper alloy, and a tin-silver-indium-bismuth alloy. In addition, the solder may contain an additive. Examples of the additive include nickel, germanium, cobalt, antimony, and silicon. The solder containing the additive exhibits improved wettability, gloss, and bonding strength, which results in improving the reliability. In this connection, rectangles depicted in the wiring boards 23*a*2, 23*a*3, 23*a*5, 23*b*2 represent the bonding areas of the third, first, and second wiring members 74, 71, and 72. In addition, for example, ultrasonic bonding may be performed for the bonding, instead of using the solder.

The semiconductor chips 41*a* to 44*a* and 41*b* to 44*b* are made of silicon as a main component. The semiconductor chips 41*a*, 42*a*, 41*b*, and 42*b* are switching elements. A switching element is an IGBT or a power MOSFET, for example. The semiconductor chips 41*a*, 42*a*, 41*b*, and 42*b* of this type each have a drain electrode or collector electrode serving as an input electrode (main electrode) on the rear surface thereof. In addition, the semiconductor chips 41*a*, 42*a*, 41*b*, and 42*b* each have a gate electrode 41*a*1, 42*a*1, 41*b*1, or 42*b*1 serving as a control electrode and a source electrode or emitter electrode serving as an output electrode (main electrode) on the front surface thereof. The rear surfaces of these semiconductor chips 41*a*, 42*a*, 41*b*, and 42*b* are bonded to the wiring boards 23*a*2 and 23*b*2 using the above-described solder (not illustrated). In addition, a sintered metal may be used, instead of the solder. The sintered metal contains silver or a silver alloy as a main component. The above solder and sintered metal may be used not only for the bonding between the semiconductor chips 41*a* to 44*a* and 41*b* to 44*b* and the wiring boards 23*a*2 and 23*b*2 but also for bonding the first to third wiring members 71, 72, and 74 to the wiring boards 23*a*3, 23*a*5, 23*b*2, and 23*a*2.

The semiconductor chips 43*a*, 44*a*, 43*b*, and 44*b* are diode elements. The diode elements are free wheeling diodes (FWDs). For example, such a diode element includes a Schottky barrier diode (SBD) or a PN junction diode. The semiconductor chips 43*a*, 44*a*, 43*b*, and 44*b* of this type each have a cathode electrode serving as an output electrode (main electrode) on the rear surface thereof, and an anode electrode serving as an input electrode (main electrode) on the front surface thereof. The rear surfaces of these semiconductor chips 43*a*, 44*a*, 43*b*, and 44*b* are bonded to the wiring boards 23*a*2 and 23*b*3 using the solder (not illustrated).

In this connection, each semiconductor chip 41*a* to 44*a* and 41*b* to 44*b* may be a reverse-conducting (RC)-IGBT element. An RC-IGBT element is formed by integrating a switching element and a diode element into one semiconductor chip. Alternatively, in place of the semiconductor chips 41*a* to 44*a* and 41*b* to 44*b*, semiconductor chips that are power MOSFETs made of silicon carbide as a main component may be used. Such a semiconductor chip includes FWD together with power MOSFET.

The above-described insulated circuit substrates 20*a* and 20*b* and semiconductor chips 41*a* to 44*a* and 41*b* to 44*b* are wired using the following bonding wires 51*a* to 55*a*, 51*b* to 56*b*, and 57 to 59.

The bonding wires 51*a* and 52*a* for control wires are electrically connected to the wiring board 23*a*1 and the gate electrodes 41*a*1 and 42*a*1 of the semiconductor chips 41*a* and 42*a*. The bonding wires 53*a* and 54*a* are electrically connected to the wiring boards 23*a*3 and 23*a*5, the main electrodes of the semiconductor chips 41*a* and 42*a*, and the main electrodes of the semiconductor chips 43*a* and 44*a*.

The bonding wires 51*b* and 52*b* for control wires are electrically connected to the wiring board 23*b*1 and the gate electrodes 41*b*1 and 42*b*1 of the semiconductor chips 41*b* and 42*b*. The bonding wires 53*b* and 54*b* are electrically connected to the wiring boards 23*b*5 and 23*b*3, the main electrodes of the semiconductor chips 41*b* and 42*b*, and the main electrodes of the semiconductor chips 43*b* and 44*b*. The bonding wires 55*b* and 56*b* are electrically connected to the wiring board 23*b*4, the main electrodes of the semiconductor chips 41*b* and 42*b*, and the main electrodes of the semiconductor chips 43*b* and 44*b*.

In addition, the bonding wires 57 and 58 are electrically connected to the wiring board 23*a*2 of the insulated circuit substrate 20*a* and the wiring boards 23*b*3 and 23*b*5 of the insulated circuit substrate 20*b*, respectively. The bonding wires 59 are electrically connected to the wiring board 23*a*4 of the insulated circuit substrate 20*a* and the wiring board 23*b*4 of the insulated circuit substrate 20*b*.

In this connection, the bonding wires 51*a* to 55*a*, 51*b* to 56*b*, and 57 to 59 are made of a metal with high electrical conductivity, such as aluminum or copper, or an alloy containing at least one of these.

As illustrated in FIG. 3, the wiring unit 70 includes the above-described first and second wiring members 71 and 72 and the wiring holding unit 73 covering and holding the first and second wiring members 71 and 72. The first and second wiring members 71 and 72 are plate-like lead frames. The wiring holding unit 73 is made of a resin with insulation, for example, a thermoplastic resin. Examples of the resin here include a polyphenylene sulfide resin, a polybutylene terephthalate resin, a polybutylene succinate resin, a polyamide resin, and an acrylonitrile butadiene styrene resin. In addition, an insulating ceramic filler may be added to such a resin. Examples of the ceramic filler here include oxide, nitride, and carbide. Specific examples include silicon, aluminum, and boron.

The first wiring member 71 includes the first leg portion 71*a*, a first vertical portion 71*b*, and the first external connection portion 71*d*. One end portion of the first leg portion 71*a* of the first wiring member 71 is bonded to the wiring boards 23*a*3 and 23*a*5 of the insulated circuit substrate 20*a*. The first vertical portion 71*b* is connected to the other end portion of the first leg portion 71*a* and extends vertically upward (in the +Z direction). The first external connection portion 71*d* is connected to the first vertical portion 71*b*, extends to the outside from the lid 61, and is bent toward the front surface of the lid 61. The wiring boards 23*a*3 and 23*a*5 are wire-bonded to the main electrodes on the front surfaces of the semiconductor chips 41*a*, 42*a*, 43*a*, and 44*a* using the bonding wires 53*a* and 54*a*. Therefore, the first wiring member 71 is electrically connected to the main electrodes on the front surfaces of the semiconductor chips 41*a*, 42*a*, 43*a*, and 44*a*, so that a main current flows therethrough.

In addition, the second wiring member 72 includes the second leg portion 72*a*, a second vertical portion 72*b*, a second horizontal portion 72*c*, and the second external connection portion 72*d*. One end portion of the second leg portion 72*a* of the second wiring member 72 is bonded to the wiring board 23*b*2 of the insulated circuit substrate 20*b*. The second vertical portion 72*b* is connected to the other end portion of the second leg portion 72*a* and extends vertically upward (in the +Z direction). The second horizontal portion 72*c* extends from the second vertical portion 72*b* in the +X direction. The second external connection portion 72*d* is connected to the second horizontal portion 72*c*, extends to the outside from the lid 61, and is bent toward the front surface of the lid 61. The wiring board 23*b*2 is electrically connected to the main electrodes on the rear surfaces of the semiconductor chips 41*b*, 42*b*, 43*b*, and 44*b*. Therefore, the second wiring member 72 is electrically connected to the main electrodes on the rear surfaces of the semiconductor chips 41*b*, 42*b*, 43*b*, and 44*b*, so that a main current flows therethrough.

In addition, the third wiring member 74 is a plate-like lead frame as well. The third wiring member 74 includes the third leg portion 74*a*, a third horizontal portion 74*c*, and the third external connection portion 74*d*. One end portion of the third leg portion 74*a* of the third wiring member 74 is bonded to the wiring board 23*a*2 of the insulated circuit substrate 20*a*. The third horizontal portion 74*c* is connected to the other end portion of the third leg portion 74*a* and extends in the +X direction. The third external connection portion 74*d* is connected to the third horizontal portion 74*c*, extends to the outside from the lid 61, and is bent toward the front surface of the lid 61. The wiring board 23*a*2 is electrically connected to the main electrodes on the rear surfaces of the semiconductor chips 41*a* to 44*a*. Therefore, the third wiring member 74 is electrically connected to the main electrodes on the rear surfaces of the semiconductor chips 41*a* to 44*a*, so that a main current flows therethrough.

In this connection, the control terminals 75 and 76 are electrically connected to the wiring boards 23*a*1 and 23*b*1, respectively, although the detailed illustration is omitted. A control signal input from the outside is input to the gate electrodes 41*a*1, 42*a*1, 41*b*1, and 42*b*1 of the semiconductor chips 41*a*, 42*a*, 41*b*, and 42*b* via the control terminals 75 and 76, wiring boards 23*a*1 and 23*b*1, and bonding wires 51*a*, 52*a*, 51*b*, and 52*b*.

The first to third wiring members 71, 72, and 74 and control terminals 75 and 76 are made of a metal with high electrical conductivity as a main component. Examples of the metal here include aluminum, copper, iron, nickel, and an alloy containing at least one of these. Plating may be performed on the surfaces of the first to third wiring members 71, 72, and 74 to improve their corrosion resistance. Examples of the plating material used here include nickel, a nickel-phosphorus alloy, and a nickel-boron alloy. In addition, for the bonding between the first to third wiring members 71, 72, and 74 and the wiring boards 23*a*3, 23*a*5, 23*b*2, and 23*a*2, a solder or sintered metal may be used, as in the case of bonding the semiconductor chips 41*a* to 44*a* and 41*b* to 44*b*. Alternatively, the first to third wiring members 71, 72, and 74 may be bonded directly to the wiring boards 23*a*3, 23*a*5, 23*b*2, and 23*a*2 by ultrasonic waves or a laser.

The heat dissipation base 30 has a plate shape and is rectangular in plan view. The heat dissipation base 30 has a long side 30*a*, a short side 30*b*, a long side 30*c*, and a short side 30*d* on the four sides of the front surface 32*a* and rear surface 32*b*. A substrate region 32*a*1 where the insulated circuit substrates 20*a* and 20*b* are disposed is set at the center of the front surface 32*a* of the heat dissipation base 30. In plan view, the fastening holes 31*a* to 31*d* that extend from the front surface 32*a* to the rear surface 32*b* of the heat dissipation base 30 are formed in order at the respective corners with the substrate region 32*a*1 therebetween in the heat dissipation base 30. For example, the fastening holes 31*a* and 31*c* have the substrate region 32*a*1 therebetween on the diagonal line.

This heat dissipation base 30 is made of a metal with high thermal conductivity as a main component. Examples of the metal here include copper, aluminum, and an alloy containing at least one of these. Plating may be performed on the surface of the heat dissipation base 30 to improve its corrosion resistance. Examples of the plating material used here include nickel, a nickel-phosphorus alloy, and a nickel-boron alloy.

In addition, a heat dissipation region 32*b*1 is set at the center of the rear surface 32*b* of the heat dissipation base 30. The heat dissipation region 32*b*1 is set on the opposite side of the substrate region 32*a*1 set on the front surface 32*a* for disposing the insulated circuit substrates 20*a* and 20*b*. A plurality of solid heat dissipation members 33 made of a phase change material are provided in the heat dissipation region 32*b*1. The heat dissipation members 33 are phase change thermal grease. More specifically, the heat dissipation members 33 are made from a phase change material that is solid and when heated, melts into a paste. Such a material contains a thermoplastic resin as a main component and also contains a phase change material as a binder. Examples of the thermoplastic resin include a polyphenylene sulfide resin, a polybutylene terephthalate resin, a polybutylene succinate resin, a polyamide resin, and an acrylonitrile butadiene styrene resin. The heat dissipation members 33 are solid at room temperature, and are softened (change into a paste) at a temperature ranging from 40° C. to 60° C., inclusive. In the case of FIG. 6, the solid heat dissipation members 33 each have a circular tablet shape in plan view and are arranged vertically and horizontally in a matrix form in the heat dissipation region 32*b*1. In this connection, the arrangement of the heat dissipation members 33 illustrated in FIG. 6 is an example. The shape of each heat dissipation member 33 in plan view is not limited to be circular, but may be rectangular or triangle. Alternatively, triangular heat dissipation members 33 may be arranged at the corners of the heat dissipation region 32*b*1, and circular heat dissipation members 33 may be arranged inside the heat dissipation region 32*b*1.

In addition, a loop-shaped region 32*b*2 is set on the rear surface 32*b* of the heat dissipation base 30. The loop-shaped region 32*b*2 has a continuous loop shape surrounding the fastening holes 31*a* to 31*d* and heat dissipation region 32*b*1. In the case of FIG. 6, the loop-shaped region 32*b*2 corresponds to the outer periphery of the rear surface 32*b* of the heat dissipation base 30, includes subregions that are respectively parallel to the long side 30*a*, short side 30*b*, long side 30*c*, and short side 30*d* in this order, and have rounded corners. Elastic members 34 are provided in the loop-shaped region 32*b*2 of the heat dissipation base 30. The elastic members 34 contain a low-hardness material with heat dissipation as a main component. For example, such a material is silicone. The heights of the elastic members 34 measured from the rear surface 32*b* of the heat dissipation base 30 may be substantially equal to or greater than those of the heat dissipation members 33. In addition, the width of the loop-shaped region 32*b*2 in which the elastic members 34 are provided is set so that, when the elastic members 34 are sandwiched between the rear surface 32*b* of the heat dissipation base 30 and the cooling surface 91 of the cooling module 90, as will be described later, the elastic members 34 do not deform but remain stable.

In addition, in the case of FIG. 6, the elastic members 34 are provided at the four corners of the loop-shaped region 32*b*2. These elastic members 34 are L-shaped in plan view. In order to keep the gap stable between the rear surface 32*b* of the heat dissipation base 30 and the cooling surface 91 of the cooling module 90, as described later, for example, the elastic member 34 of FIG. 6 adjacent to the fastening hole 31*a* extends at least to positions corresponding to the boundary points of the fastening hole 31*a* closest to the long side 30*a* and short side 30*b*. The same applies to the other elastic members 34.

Figure 7:
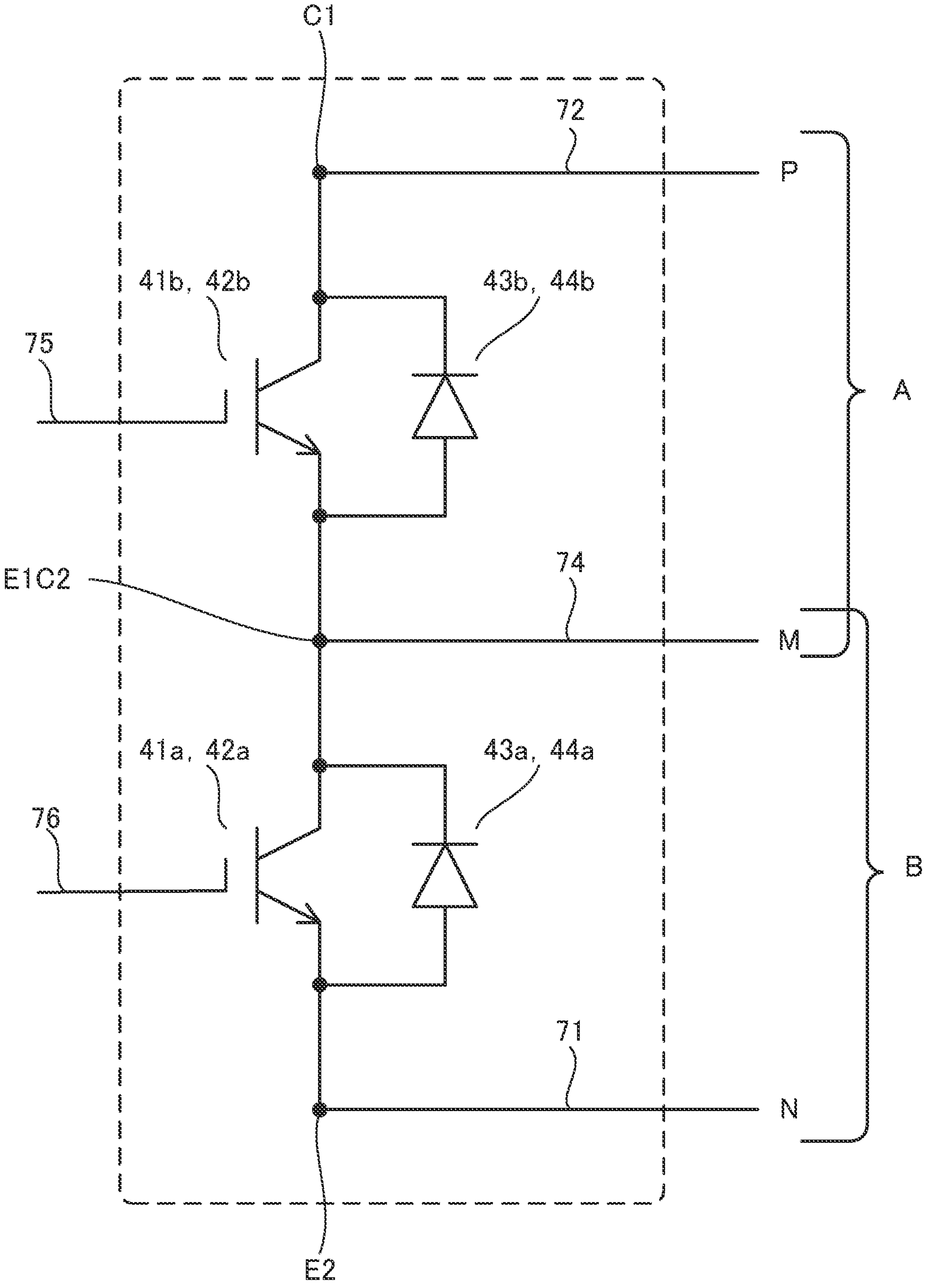
FIG. 7 is an equivalent circuit diagram representing functions of the semiconductor module according to the first embodiment.

The following describes an equivalent circuit representing functions of the semiconductor module 10 with reference to FIG. 7. FIG. 7 is an equivalent circuit diagram representing functions of the semiconductor module according to the first embodiment. As illustrated in FIG. 7, the semiconductor module 10 has a half-bridge circuit with an upper arm part A and a lower arm part B. The upper arm part A of the semiconductor module 10 includes the insulated circuit substrate 20*b*, the bonding wires 51*b* to 56*b* provided on the insulated circuit substrate 20*b*, the semiconductor chips 41*b* to 44*b*, and the second wiring member 72. The upper arm part A also includes the bonding wires 57 to 59, the wiring board 23*a*2 of the insulated circuit substrate 20*a*, and the third wiring member 74 disposed on the wiring board 23*a*2.

The lower arm part B of the semiconductor module 10 includes the insulated circuit substrate 20*a*, the bonding wires 51*a* to 55*a* provided on the insulated circuit substrate 20*a*, the semiconductor chips 41*a* to 44*a*, and the first wiring member 71. The lower arm part B also includes the third wiring member 74. In addition, the two insulated circuit substrates 20*a* and 20*b* are connected with the bonding wires 57 to 59. With this configuration, the upper arm part A and the lower arm part B are connected to each other. Thus, the semiconductor module 10 functions as a half-bridge circuit with the upper arm part A and the lower arm part B.

In this semiconductor module 10, a wire connecting a connection point P connected to the positive electrode of the power supply 3 (see FIG. 1) and a connection point C1 connected to the input electrodes of the semiconductor chips 41*b* and 42*b* corresponds to the second wiring member 72. That is, the second wiring member 72 is a P terminal forming a positive-electrode input terminal in the half-bridge circuit. A wire connecting a connection point M connected to the terminal of the load 4 (see FIG. 1) and a connection point E1C2 connected to the output electrodes of the semiconductor chips 41*b* and 42*b* and the input electrodes of the semiconductor chips 41*a* and 42*a* corresponds to the third wiring member 74. That is, the third wiring member 74 is an M terminal forming an output terminal in the half-bridge circuit. A wire connecting a connection point N connected to the negative electrode of the power supply 3 and a connection point E2 connected to the output electrodes of the semiconductor chips 41*a* and 42*a* corresponds to the first wiring member 71. That is, the first wiring member 71 is an N terminal forming a negative-electrode input terminal in the half-bridge circuit.

Figure 8:
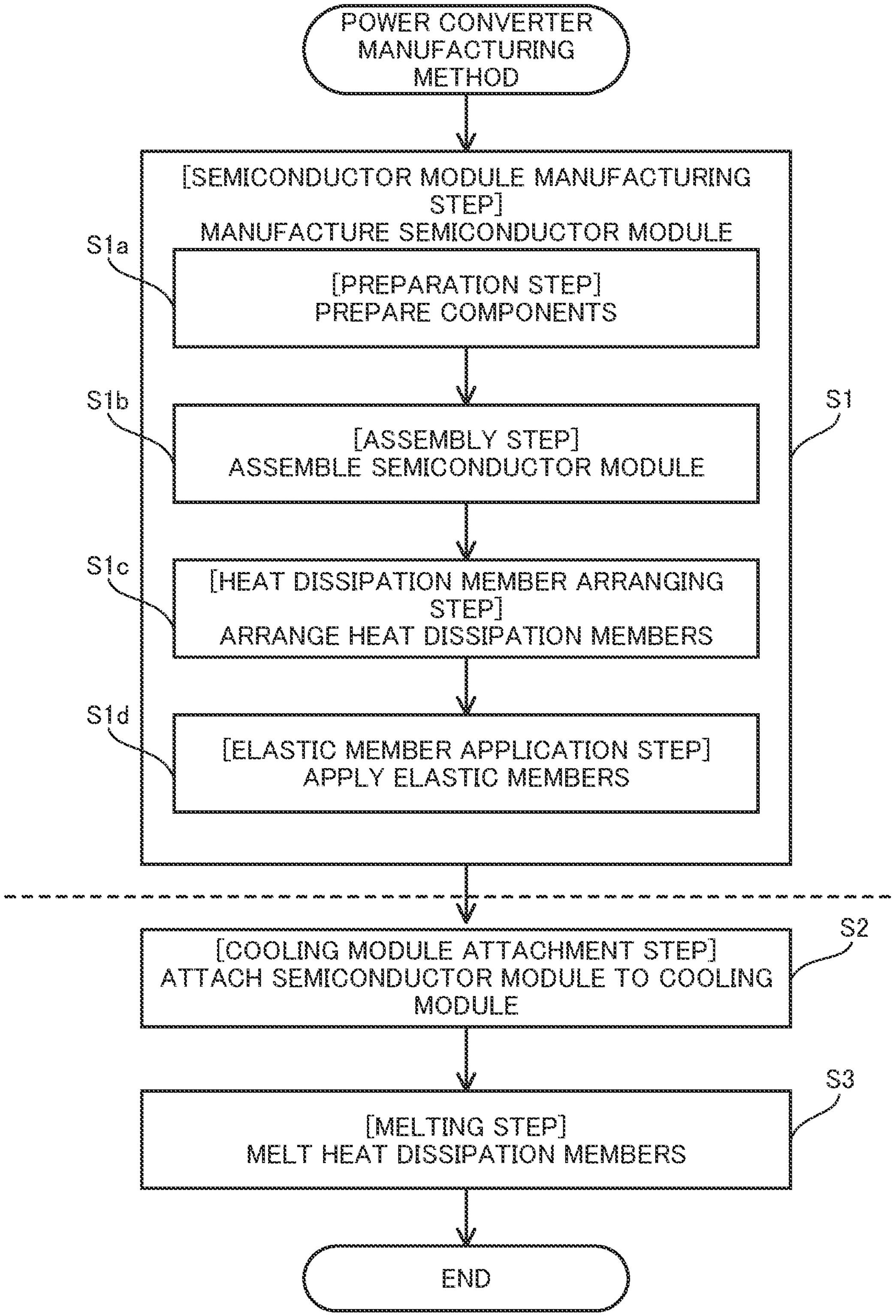
FIG. 8 is a flowchart illustrating a power converter manufacturing method according to the first embodiment.
Figure 9:
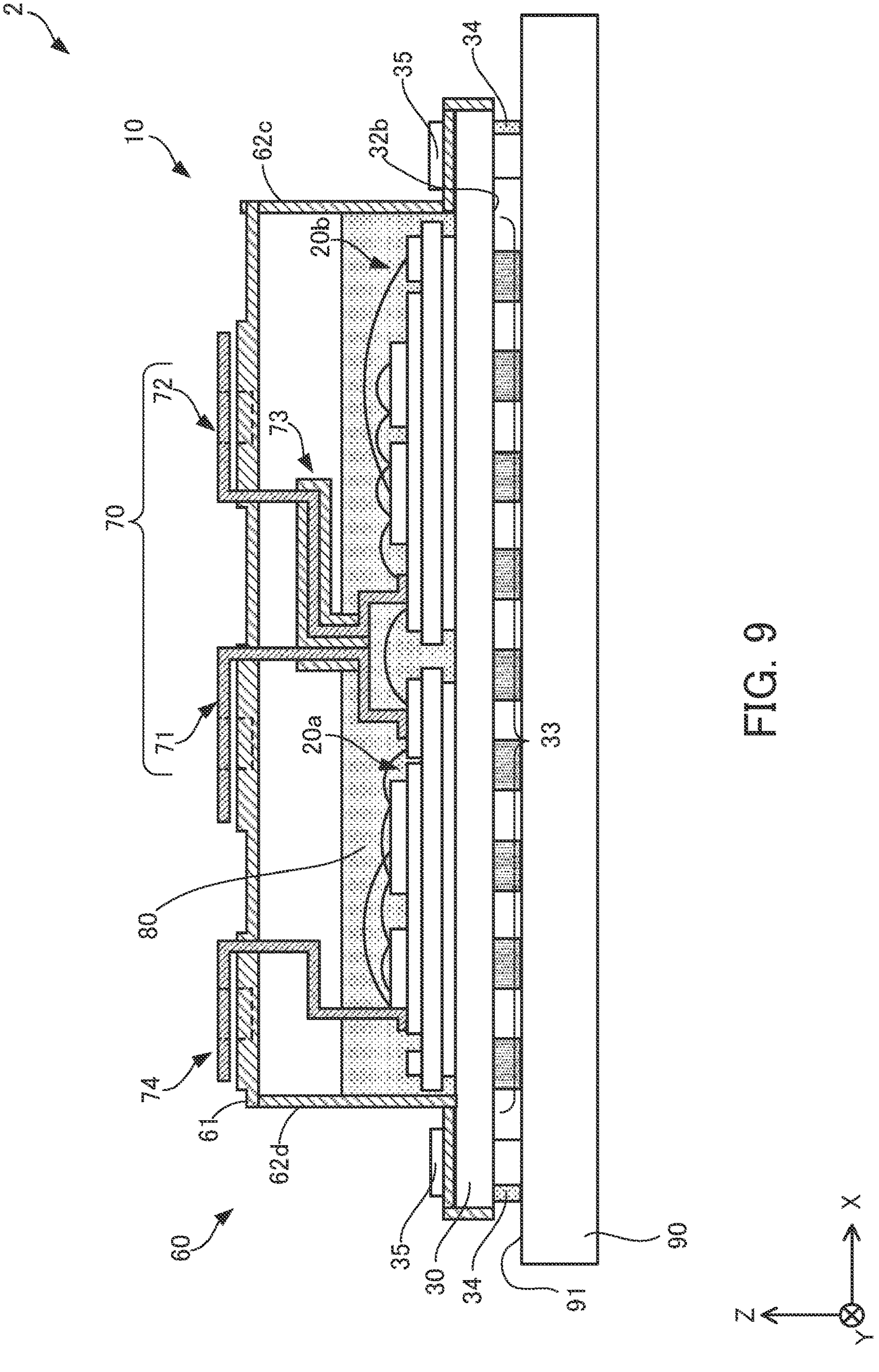
FIG. 9 is a view for describing a cooling module attachment step included in the power converter manufacturing method according to the first embodiment.
Figure 10:
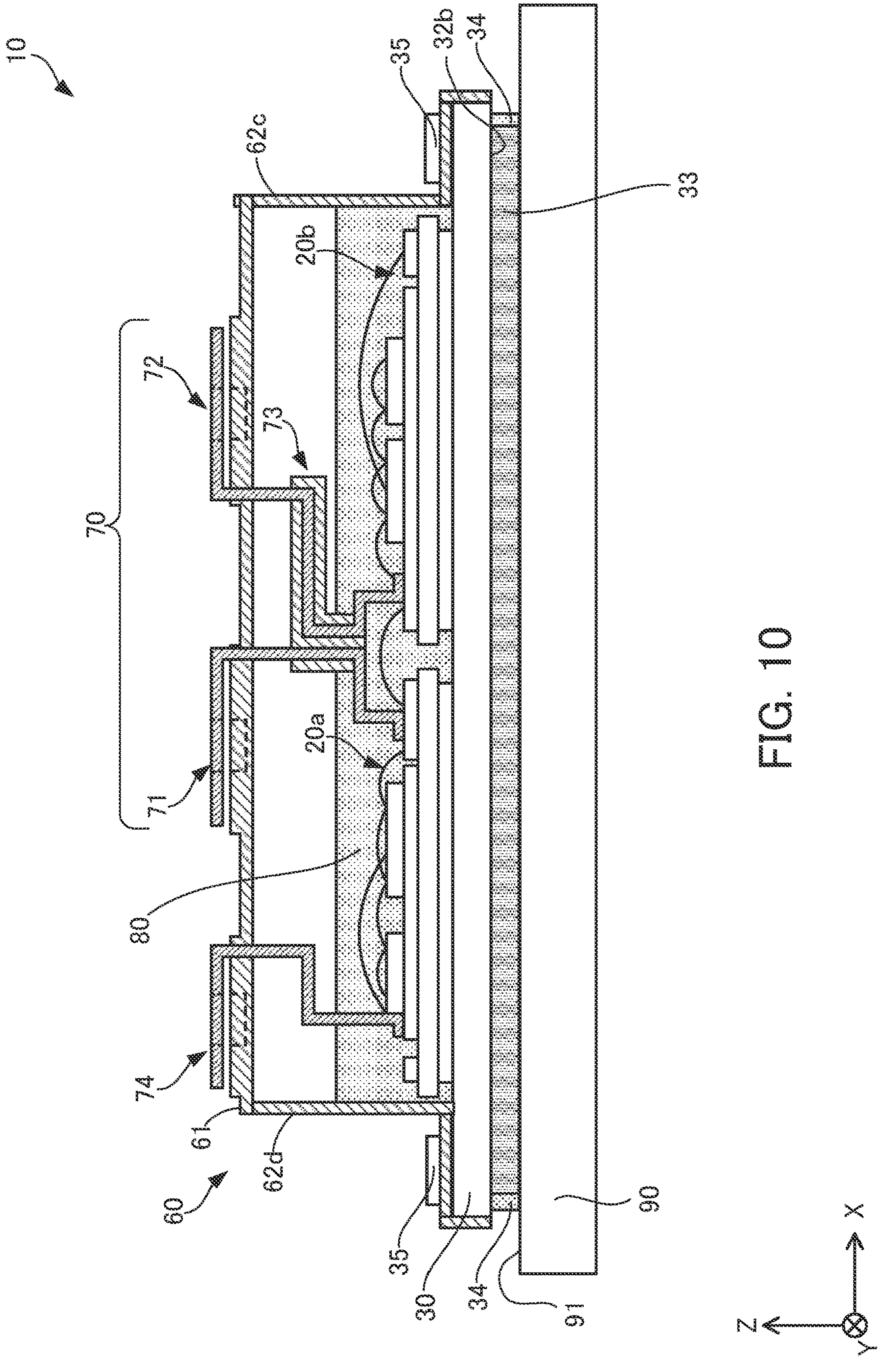
FIG. 10 is a view for describing a melting step included in the power converter manufacturing method according to the first embodiment.

The following describes a method of manufacturing the power converter 2 with the above-described semiconductor module 10 with reference to FIG. 8. FIG. 8 is a flowchart illustrating a power converter manufacturing method according to the first embodiment. FIG. 9 is a view for describing a cooling module attachment step included in the power converter manufacturing method according to the first embodiment. FIG. 10 is a view for describing a melting step included in the power converter manufacturing method according to the first embodiment.

First, a semiconductor module manufacturing step of manufacturing the semiconductor module 10 is performed (step S1). In manufacturing the semiconductor module 10, which is included in the power converter 2, first, a preparation step of preparing components of the semiconductor module 10 is performed (step S1*a*). For example, the components include the semiconductor chips 41*a* to 44*a* and 41*b* to 44*b*, insulated circuit substrates 20*a* and 20*b*, heat dissipation base 30, wiring unit 70, third wiring member 74, case 60, and the raw materials of the heat dissipation members 33 and elastic members 34. In addition to these components, other components needed for manufacturing the semiconductor module 10 and manufacturing equipment are prepared.

Then, an assembly step of assembling the semiconductor module 10 is performed (step S1*b*). The insulated circuit substrates 20*a* and 20*b* are disposed via a solder plate in the substrate region 32*al* on the front surface 32*a* of the heat dissipation base 30. The semiconductor chips 41*a* to 44*a* and 41*b* to 44*b* are each disposed via a solder plate on the wiring board 23*a*2 of the insulated circuit substrate 20*a* or the wiring board 23*b*2 of the insulated circuit substrate 20*b*. Then, by heating and melting the solder plates into solder and curing the solder, the heat dissipation base 30, insulated circuit substrates 20*a* and 20*b*, and semiconductor chips 41*a* to 44*a* and 41*b* to 44*b* are bonded in order. Then, wiring is performed using the bonding wires 51*a* to 55*a*, 51*b* to 56*b*, 57, 58, and 59, as illustrated in FIG. 5. In addition, the first to third wiring members 71, 72, and 74 are bonded at predetermined positions on the insulated circuit substrates 20*a* and 20*b*. Then, the case 60 is attached to the outer periphery of the heat dissipation base 30 via an adhesive. In this connection, the sealing member 80 is applied to fill the inside of the case 60.

Then, a heat dissipation member arranging step of arranging the plurality of heat dissipation members 33 to the rear surface 32*b* of the heat dissipation base 30 of the semiconductor module 10 is performed (step S1*c*). The plurality of heat dissipation members 33 in a solid state are arranged in the heat dissipation region 32*b*1 on the rear surface 32*b* of the heat dissipation base 30. For example, this arrangement is performed by a dispensing or printing method.

Then, an elastic member application step of applying the elastic members 34 to the loop-shaped region 32*b*2 on the rear surface 32*b* of the heat dissipation base 30 is performed (step S1*d*). The elastic members 34 are applied to the corners of the loop-shaped region 32*b*2 on the rear surface 32*b* of the heat dissipation base 30 by a dispenser. In the manner described above, the semiconductor module 10 illustrated in FIGS. 2 to 6 is manufactured.

Thus manufactured semiconductor module 10 may be shipped to a place where the power converter 2 is to be assembled, for example. Since the heat dissipation members 33 of the semiconductor module 10 to be carried are not in a paste state but in a solid state because of the shipment, the heat dissipation members 33 do not adhere to their surroundings. It is thus possible to carry the semiconductor module 10 reliably, without allowing the heat dissipation members 33 to make their surroundings dirty or reducing the volume of the heat dissipation members 33. In this connection, step S1*c* and step S1*d* may be performed simultaneously or in a reversed order.

Then, a cooling module attachment step of attaching thus manufactured semiconductor module 10 to a cooling module is performed (step S2). Here, the semiconductor module 10 is arranged on the cooling surface 91 of the cooling module 90. At this time, the semiconductor module 10 is arranged such that the fastening holes 31*a* to 31*d* of the semiconductor module 10 are aligned to the fastening holes (not illustrated) of the cooling module 90. In this connection, for example, the cooling module 90 may be a cooling fin or a cooling device that achieves cooling through circulation of a coolant. In the first embodiment, the cooling module 90 is a cooing fin, for example. The cooling surface 91 of the cooling module 90 may be substantially flat.

The screws 35 are inserted into the fastening holes 31*a* to 31*d* of the semiconductor module 10 and are then tightened into the fastening holes of the cooling module 90. By the tightening of the screws 35, the heat dissipation members 33 are sandwiched between the rear surface 32*b* of the heat dissipation base 30 and the cooling surface 91 of the cooling module 90, as illustrated in FIG. 9. In addition, the elastic members 34 are sandwiched between the rear surface 32*b* of the heat dissipation base 30 and the cooling surface 91 of the cooling module 90. In this manner, the cooling module 90 is attached to the semiconductor module 10, thereby obtaining the power converter 2.

After that, a melting step of melting the heat dissipation members 33 is performed (step S3). When heated, the heat dissipation members 33 change from solid to paste (liquid). For example, this heating is achieved by inputting a control signal to the semiconductor chips 41*a* to 44*a* and 41*b* to 44*b* of the power converter 2 configured at step S2. When a current flows through the semiconductor chips 41*a* to 44*a* and 41*b* to 44*b*, the semiconductor chips 41*a* to 44*a* and 41*b* to 44*b* generate heat. The heat from the semiconductor chips 41*a* to 44*a* and 41*b* to 44*b* is conducted from the heat dissipation base 30 to the heat dissipation members 33, which melts the heat dissipation members 33. At this time, as illustrated in FIG. 10, the heat dissipation members 33 melt, but the gap between the cooling surface 91 of the cooling module 90 and the rear surface 32*b* of the heat dissipation base 30 is kept by the elastic members 34. Therefore, the gap is not narrowed, but the melting heat dissipation members 33 spread in the gap.

Figure 11:
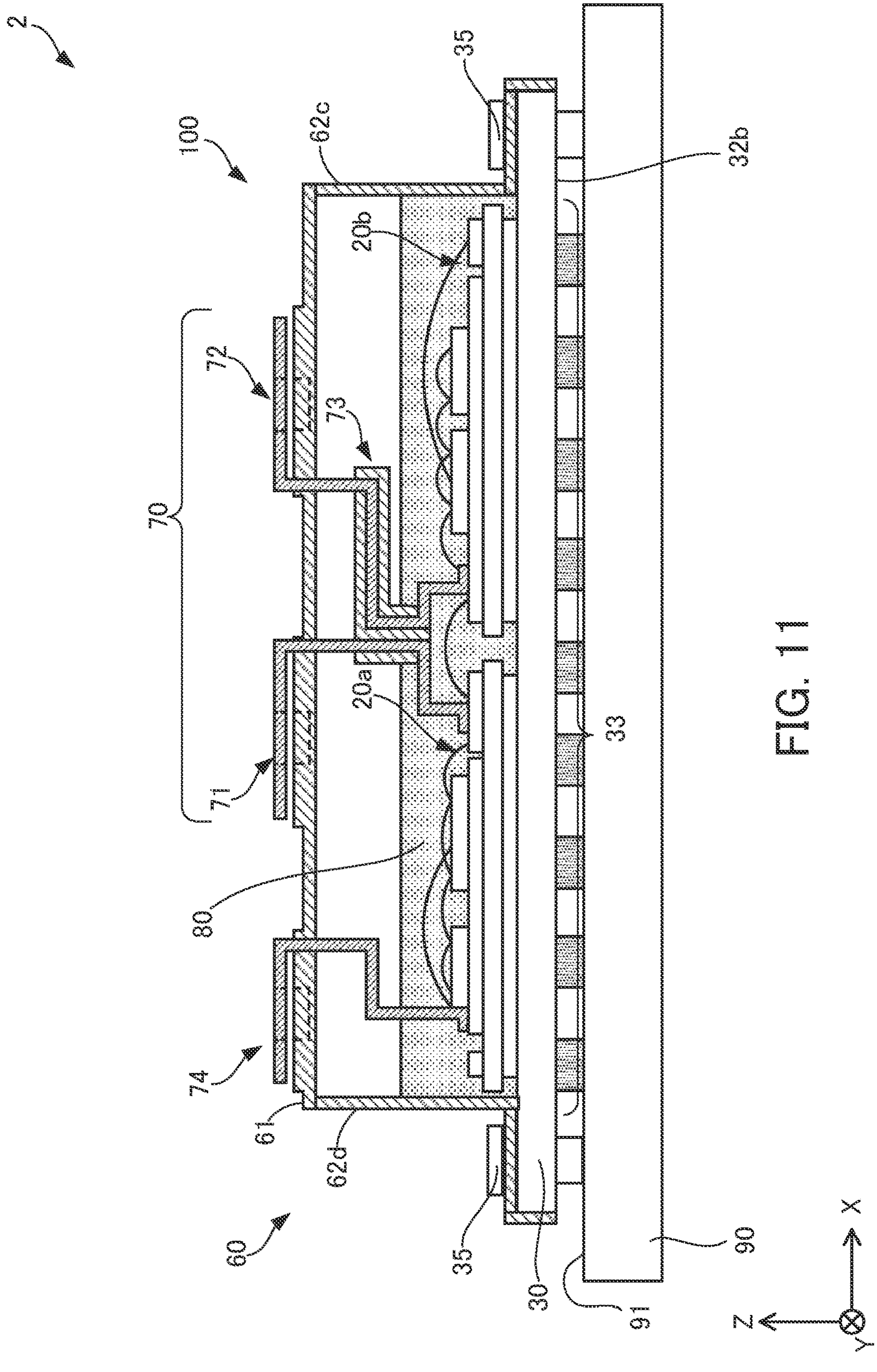
FIG. 11 illustrates a cooling module attachment step included in a power converter manufacturing method according to a reference example.
Figure 12:
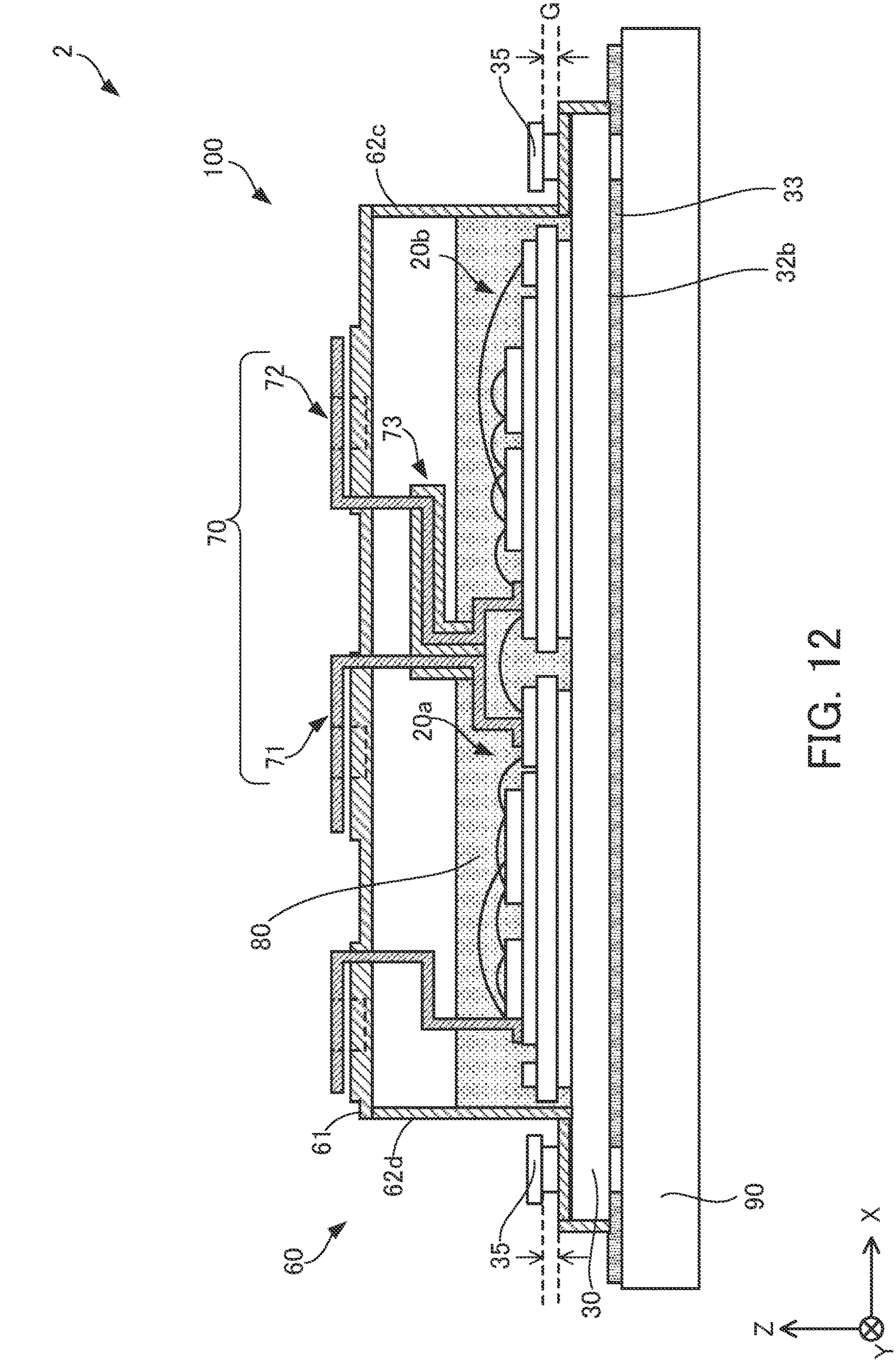
FIG. 12 illustrates a melting step included in the power converter manufacturing method according to the reference example.

The following describes a reference example in which the elastic members 34 are not provided on the rear surface 32*d* of the heat dissipation base 30 of the semiconductor module 10, with reference to FIGS. 11 and 12. FIG. 11 illustrates a cooling module attachment step included in a power converter manufacturing method according to the reference example. FIG. 12 illustrates a melting step included in the power converter manufacturing method according to the reference example.

In the case of the reference example as well, a semiconductor module 100 and then a power converter 2 are manufactured according to the flowchart of FIG. 8. However, in the semiconductor module 100 of the reference example, only the heat dissipation members 33 are provided on the rear surface 32*b* of the heat dissipation base 30, but the elastic members 34 are not provided. The other configuration is the same as that of the semiconductor module 10.

A cooling module attachment step of attaching this semiconductor module 100 to the cooling module 90 is performed (step S2). The semiconductor module 100 is arranged on the cooling surface 91 of the cooling module 90. At this time, the semiconductor module 100 is arranged such that the fastening holes 31*a* to 31*d* of the semiconductor module 100 are aligned to the fastening holes (not illustrated) of the cooling module 90. Then, the screws 35 are inserted into the fastening holes 31*a* to 31*d* of the semiconductor module 100 and are then tightened into the fastening holes of the cooling module 90. By the tightening of the screws 35, the heat dissipation members 33 are sandwiched between the rear surface 32*b* of the heat dissipation base 30 and the cooling surface 91 of the cooling module 90, as illustrated in FIG. 11. In this manner, the cooling module 90 is attached to the semiconductor module 100, thereby obtaining the power converter 2.

After that, a melting step of melting the heat dissipation members 33 is performed (step S3). The heating for this melting is achieved in the same manner as that in the first embodiment. When the heat dissipation members 33 melt, the melting heat dissipation members 33 are sandwiched between the cooling surface 91 of the cooling module 90 and the rear surface 32*b* of the heat dissipation base 30, and their thicknesses are reduced, as illustrated in FIG. 12. In addition, the melting heat dissipation members 33 spread over the cooling surface 91 of the cooling module 90. Thereby, a gap G is generated between the front surface 32*a* of the heat dissipation base 30 and each screw 35. Therefore, the tightening torque of the screws 35 joining the semiconductor module 100 to the cooling module 90 is reduced. This leads to a reduction in the heat dissipation of the semiconductor module 100, and thus may reduce the reliability of the power converter 2.

The above-described semiconductor module 10 includes the following components: the semiconductor chips 41*a* to 44*a* and 41*b* to 44*b*; the insulated circuit substrates 20*a* and 20*b* including the wiring boards 23*a*2 and 23*b*2 at the front surfaces thereof, the wiring boards 23*a*2 and 23*b*2 having the semiconductor chips 41*a* to 44*a* and 41*b* to 44*b* bonded thereto; and the heat dissipation base 30 having the substrate region 32*a*1 set on the front surface 32*a* thereof and the fastening holes 31*a* to 31*d* located outside the substrate region 32*a*1 with the substrate region 32*a*1 therebetween in plan view, the substrate region 32*a*1 having the insulated circuit substrates 20*a* and 20*b* bonded thereon, the fastening holes 31*a* to 31*d* allowing the screws 35 to go through. In addition, the semiconductor module 10 includes the solid heat dissipation members 33 made of a phase change material provided in the heat dissipation region 32*b*1 that is set on the opposite side of the substrate region 32*a*1 on the rear surface 32*b* of the heat dissipation base 30; and the elastic members 34 provided in the loop-shaped region 32*b*2 that is set on the rear surface 32*b* of the heat dissipation base 30 so as to surround the fastening holes 31*a* to 31*d* and the heat dissipation region 32*b*1.

This semiconductor module 10 is arranged on the cooling module 90, and is joined to the cooling module 90 by the screws 35. The cooling module 90 has the cooling surface 91. The cooling surface 91 is provided on the rear surface 32*b* of the heat dissipation base 30 with the elastic members 34 therebetween, and the screws 35 are inserted into the fastening holes 31*a* to 31*d* to fasten the heat dissipation base 30, so that the cooling surface 91 and the heat dissipation base 30 sandwich the elastic members 34 therebetween. The heat dissipation members 33 are sandwiched between the rear surface 32*b* of the heat dissipation base 30 and the cooling surface 91 and are located inside the elastic members 34.

In this case, when the heat dissipation members 33 melt, the gap between the heat dissipation base 30 and the cooling module 90 is kept by the elastic members 34. Therefore, no gap is generated between the heat dissipation base 30 and each screw 35, which prevents a reduction in the tightening torque of the screws 35 joining the semiconductor module 10 to the cooling module 90. In addition, since the gap between the heat dissipation base 30 and the cooling module 90 is kept, the melting heat dissipation members 33 sufficiently spread in the gap. This prevents a reduction in the heat dissipation of the semiconductor module 10, and thus prevents a reduction in the reliability of the power converter 2.

Figure 13:
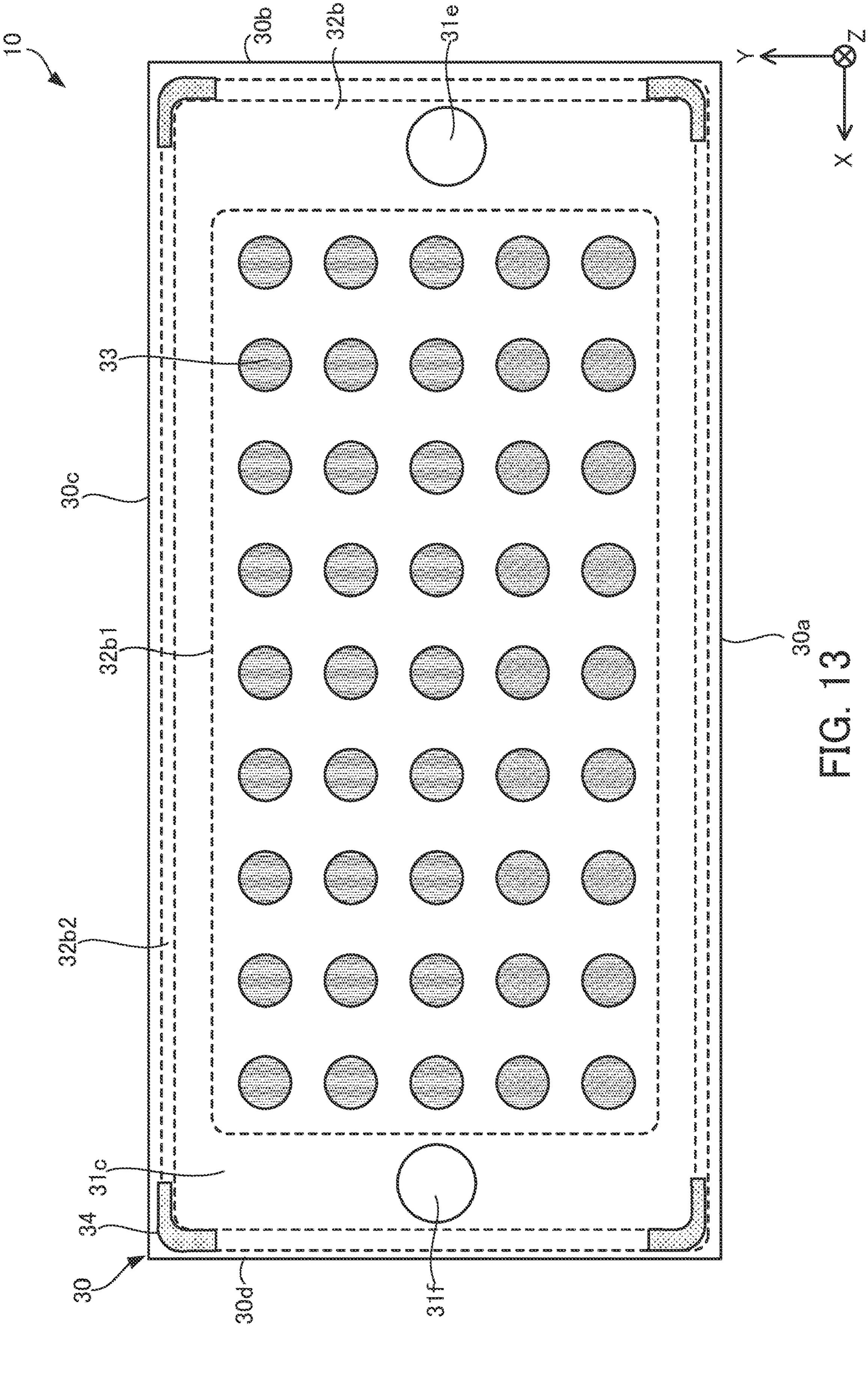
FIG. 13 is a rear surface view of a semiconductor module according to the first embodiment (variation)

In this connection, the above description relates to the case where the fastening holes 31*a* to 31*d* are formed at the four corners of the heat dissipation base 30 of the semiconductor module 10. The locations of the fastening holes 31*a* to 31*d* are not limited to the four corners of the heat dissipation base 30 of the semiconductor module 10. For example, fastening holes may be formed at the centers of the short sides 30*b* and 30*d* of the heat dissipation base 30 of the semiconductor module 10. This case will be described with reference to FIG. 13. FIG. 13 is a rear surface view of a semiconductor module according to the first embodiment (variation).

Fastening holes 31*e* and 31*f* are formed at the centers of the short sides 30*b* and 30*d* of the heat dissipation base 30 of the semiconductor module 10 of FIG. 13. In this connection, although not illustrated, fastening holes are also formed in the cooling module 90 so as to face the fastening holes 31*e* and 31*f*. In addition, the fastening holes 31*e* and 31*f* are formed in the heat dissipation base 30 so that the substrate region 32*a*1 (the heat dissipation region 32*b*1 on the opposite side thereof) is located therebetween in plan view.

In this case as well, the loop-shaped region 32*b*2 may be set so as to surround the fastening holes 31*e* and 31*f* and heat dissipation region 32*b*1 on the rear surface 32*b* of the heat dissipation base 30. In the case of FIG. 13, the loop-shaped region 32*b*2 corresponds to the outer periphery of the rear surface 32*b* of the heat dissipation base 30, includes subregions that are respectively parallel to the long side 30*a*, short side 30*b*, long side 30*c*, and short side 30*d*, and has rounded corners, as in the case of FIG. 6.

In such a case as well, when the heat dissipation members 33 melt, the elastic members 34 provided in the loop-shaped region 32*b*2 of the heat dissipation base 30 keep the gap between the heat dissipation base 30 and the cooling module 90. Therefore, no gap is generated between the heat dissipation base 30 and each screw 35, which prevents a reduction in the tightening torque of the screws 35 joining the semiconductor module 10 to the cooling module 90. Since the gap between the heat dissipation base 30 and the cooling module 90 is kept, the melting heat dissipation members 33 sufficiently spread in the gap. This prevents a reduction in the heat dissipation of the semiconductor module 10, and thus prevents a reduction in the reliability of the power converter 2.

Second Embodiment

Second and subsequent embodiments relate to various arrangements of the elastic members 34 formed in the loop-shaped region 32*b*2 of the heat dissipation base 30. In this connection, the various arrangements of the elastic members 34 in the second and subsequent embodiments are applicable not only to the case of FIG. 6 but also to the case of FIG. 13.

Figure 14:
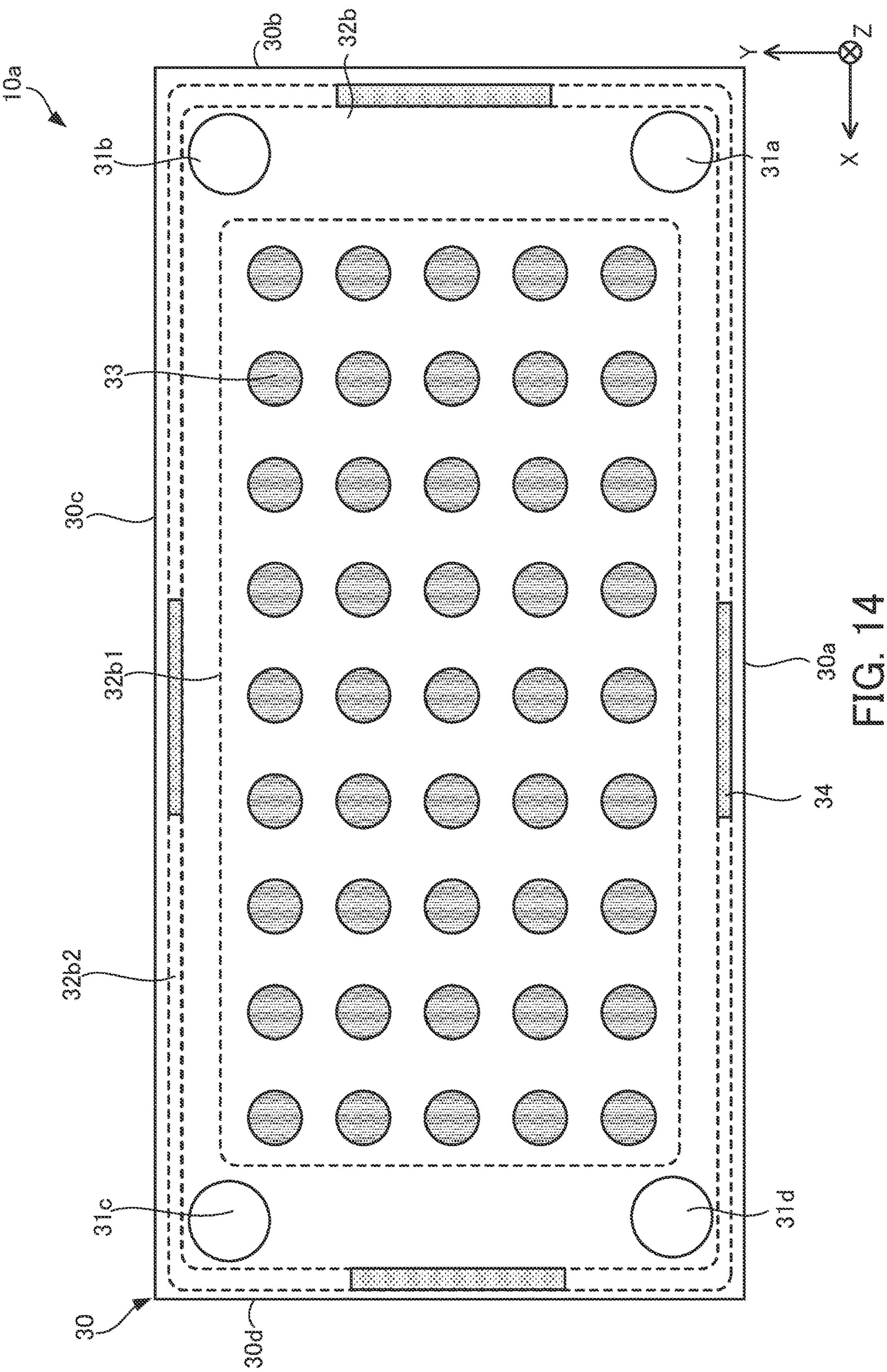
FIG. 14 is a rear surface view of a semiconductor module according to a second embodiment.

First, as the second embodiment, the following describes the case of arranging the elastic members 34 along each side of the heat dissipation base 30 with reference to FIG. 14. FIG. 14 is a rear surface view of a semiconductor module according to the second embodiment.

In a semiconductor module 10*a*, the elastic members 34 are provided at locations including the centers of the subregions of the loop-shaped region 32*b*2 respectively parallel to the long side 30*a*, short side 30*b*, long side 30*c*, and short side 30*d* of the heat dissipation base 30.

In this configuration, when the semiconductor module 10*a* is attached to the cooling module 90 by the screws 35 and then the heat dissipation members 33 are melted, the elastic members 34 provided as described above keep the gap between the heat dissipation base 30 and the cooling module 90. Therefore, a reduction in the tightening torque of the screws 35 joining the semiconductor module 10*a* to the cooling module 90 is prevented. In addition, since the gap between the heat dissipation base 30 and the cooling module 90 is kept, the melting heat dissipation members 33 sufficiently spread in the gap. This prevents a reduction in the heat dissipation of the semiconductor module 10*a*, and thus prevents a reduction in the reliability of the power converter 2.

The elastic members 34 may each have any length as long as they are able to keep the gap between the heat dissipation base 30 and the cooling module 90. In this connection, the lengths of the elastic members 34 formed in the subregions of the loop-shaped region 32*b*2 parallel to the long sides 30*a* and 30*c* are lengths measured in the X direction. On the other hand, the lengths of the elastic members 34 formed in the subregions of the loop-shaped region 32*b*2 parallel to the short sides 30*b* and 30*d* are lengths measured in the Y direction. If the elastic members 34 are too short, the elastic members 34 may be unable to support the heat dissipation base 30, which may fail to keep the gap between the heat dissipation base 30 and the cooling module 90.

Third Embodiment

Figure 15:
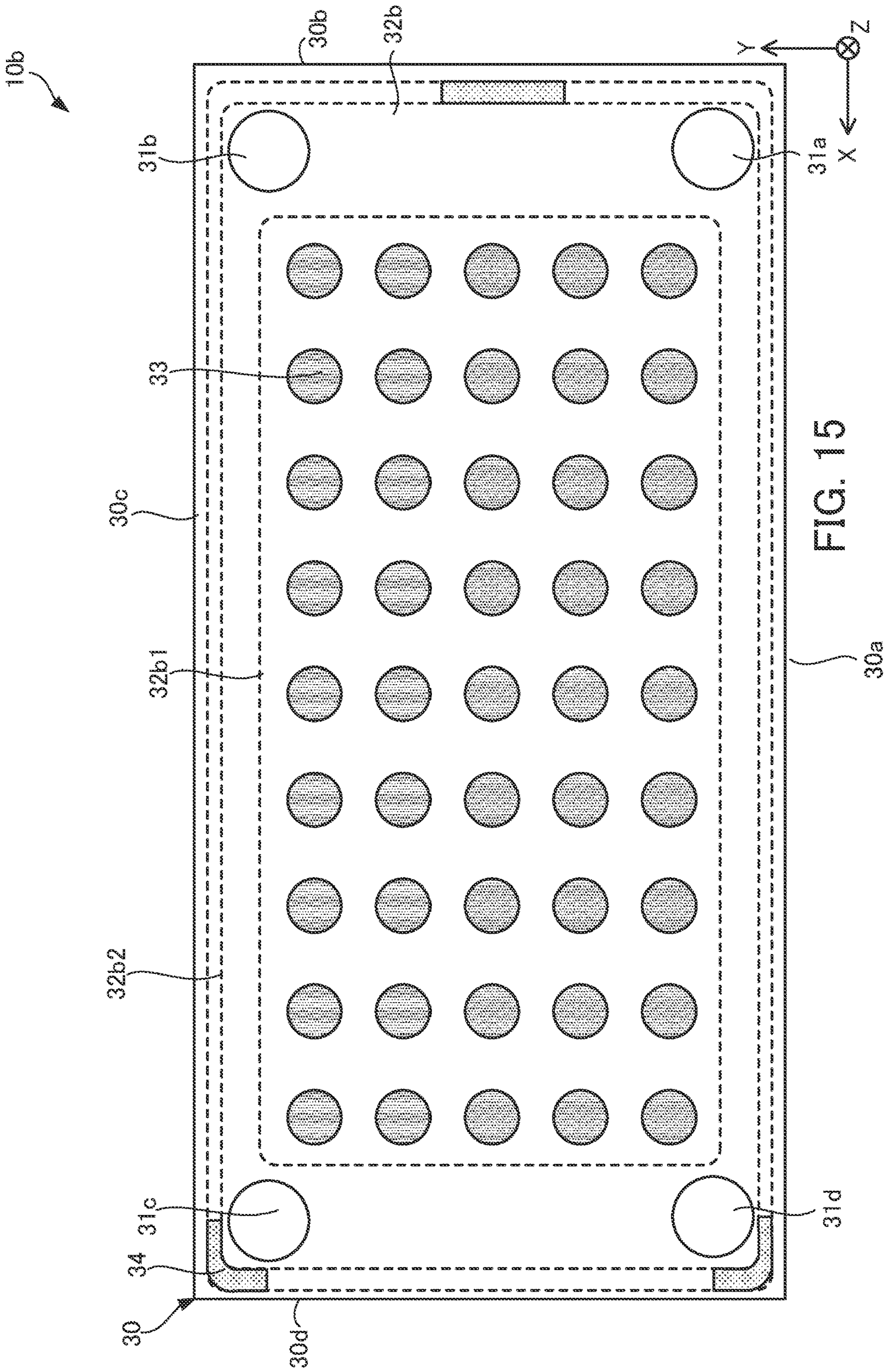
FIG. 15 is a rear surface view of a semiconductor module according to a third embodiment.

A third embodiment will be described with reference to FIG. 15. FIG. 15 is a rear surface view of a semiconductor module according to the third embodiment. In a semiconductor module 10*b*, elastic members 34 are provided at the following three locations in the loop-shaped region 32*b*2: at the corners at both ends of a subregion of the loop-shaped region 32*b*2 parallel to the short side 30*d* of the heat dissipation base 30, and at the center of a subregion of the loop-shaped region 32*b*2 parallel to the short side 30*b* opposite to the short side 30*d*.

In this configuration, when the semiconductor module 10*b* is attached to the cooling module 90 by the screws 35 and then the heat dissipation members 33 are melted, the elastic members 34 provided as described above keep the gap between the heat dissipation base 30 and the cooling module 90. This prevents a reduction in the tightening torque of the screws 35 joining the semiconductor module 10*b* to the cooling module 90. In addition, since the gap between the heat dissipation base 30 and the cooling module 90 is kept, the melting heat dissipation members 33 sufficiently spread in the gap. This prevents a reduction in the heat dissipation of the semiconductor module 10*b*, and thus prevents a reduction in the reliability of the power converter 2.

In this case as well, the elastic members 34 may each have any length as long as they are able to keep the gap between the heat dissipation base 30 and the cooling module 90, as in the second embodiment. If the elastic members 34 are too short, the elastic members 34 may deform by being sandwiched between the rear surface 32*b* of the heat dissipation base 30 and the cooling surface 91 of the cooling module 90.

Considering the second and third embodiments, the elastic members 34 of appropriate length may be discontinuously provided in a loop shape in the loop-shaped region 32*b*2 so as to keep the gap between the heat dissipation base 30 and the cooling module 90. The locations, quantity, and lengths of the elastic members 34 described in the second and third embodiments are just examples.

For example, in FIG. 14, the elastic members 34 may be provided at a plurality of locations in each of the subregions of the loop-shaped region 32*b*2 respectively parallel to the long side 30*a*, short side 30*b*, long side 30*c*, and short side 30*d* of the heat dissipation base 30. These elastic members 34 may have different lengths. Long elastic members 34 may be provided only in the subregions of the loop-shaped region 32*b*2 parallel to the long sides 30*a* and 30*c* (or short sides 30*b* and 30*d*) of the heat dissipation base 30.

Another arrangement than that illustrated in FIG. 15 may be possible, in which the elastic members 34 are formed at the following three locations of the loop-shaped region 32*b*2 of the heat dissipation base 30: at a pair of adjacent corners at both ends of one subregion of the loop-shaped region 32*b*2 parallel to one of the long sides 30*a* and 30*c* and short side 30*b*, and in another subregion that is opposite to the one subregion with the heat dissipation region 32*b*1 therebetween and is along one of the long sides 30*c* and 30*a* and short side 30*d*. That is, in the loop-shaped region 32*b*2 set along the outer periphery of the heat dissipation base 30, elastic members 34 may be formed at a pair of adjacent corners at both ends of one subregion (first side) of the loop-shaped region 32*b*2 parallel to one of the long sides 30*a* and 30*c* and short sides 30*b* and 30*b*. In addition, an elastic member 34 may be formed in another subregion (second side) of the loop-shaped region 32*b*2 that is opposite to the one subregion (first side) with the heat dissipation region 32*b*1 therebetween and is parallel to one of the long sides 30*a* and 30*c* and short sides 30*b* and 30*d*. Alternatively, the elastic members 34 are not necessarily formed at the corners in FIG. 15. For example, the elastic members 34 may be formed in the opposite end portions of the subregion of the loop-shaped region 32*b*2 parallel to the long side 30*a* and at the center of the subregion of the loop-shaped region 32*b*2 parallel to the long side 30*c*.

Fourth Embodiment

Figure 16:
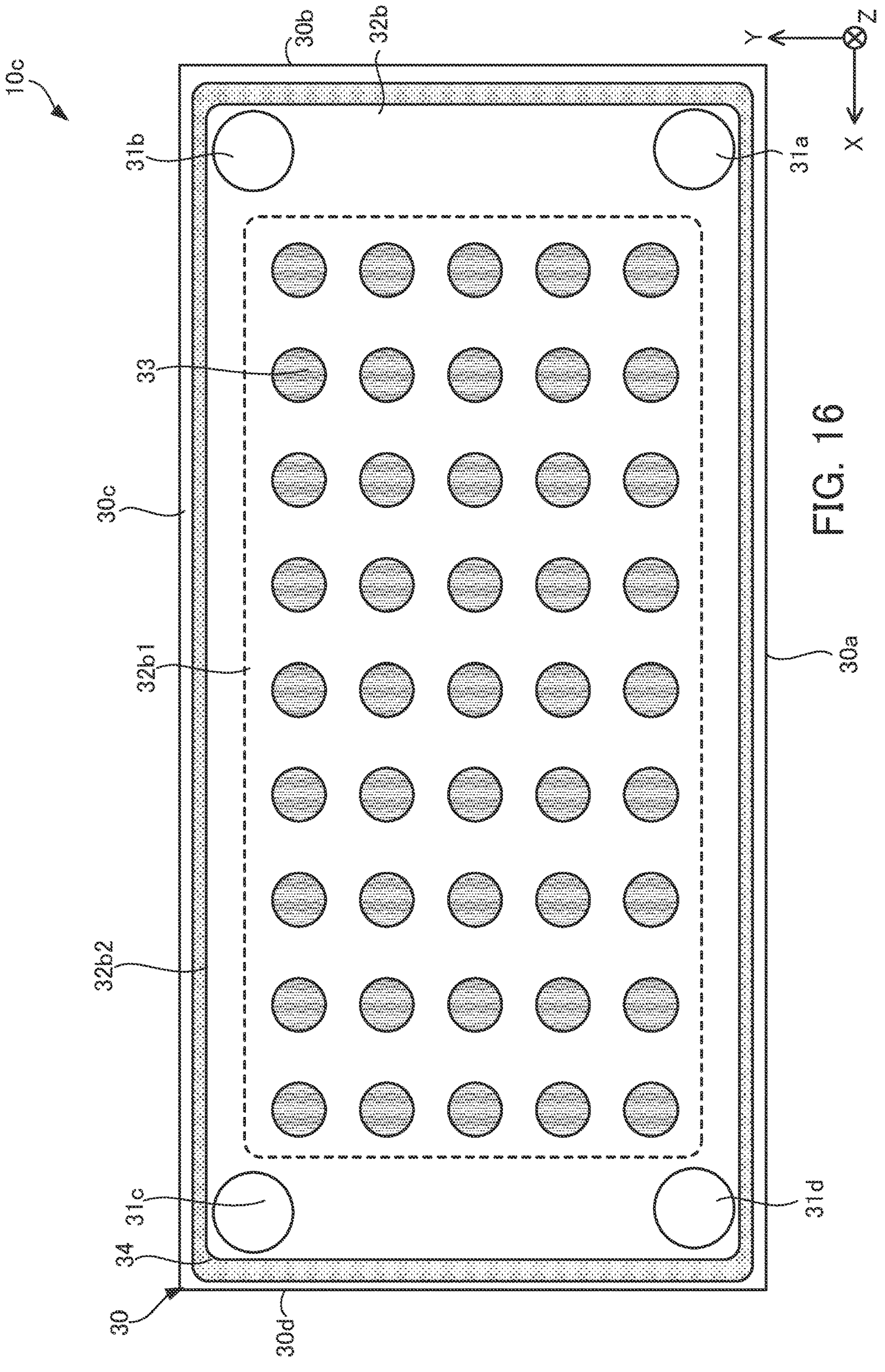
FIG. 16 is a rear surface view of a semiconductor module according to a fourth embodiment.
Figure 17:
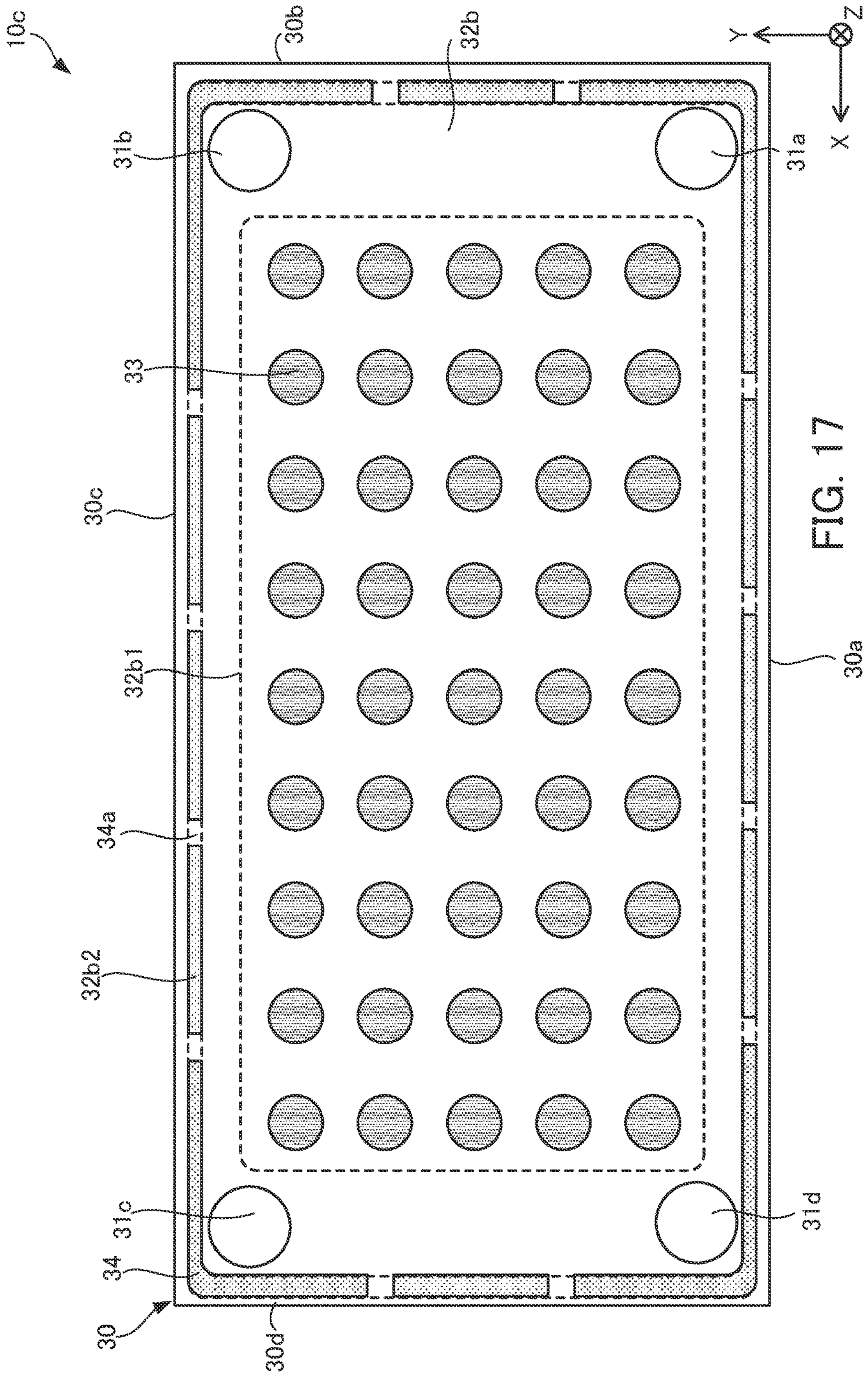
FIG. 17 is a rear surface view of a semiconductor module according to the fourth embodiment (variation).

A fourth embodiment will be described with reference to FIGS. 16 and 17. FIG. 16 is a rear surface view of a semiconductor module according to the fourth embodiment. FIG. 17 is a rear surface view of a semiconductor module according to the fourth embodiment (variation). In a semiconductor module 10*c*, an elastic member 34 is continuously provided in a loop shape in the loop-shaped region 32*b*2 of the heat dissipation base 30.

In this configuration, when the semiconductor module 10*c* is attached to the cooling module 90 by the screws 35 and then the heat dissipation members 33 are melted, the elastic member 34 provided in this manner keeps the gap between the heat dissipation base 30 and the cooling module 90. This prevents a reduction in the tightening torque of the screws 35 joining the semiconductor module 10*c* to the cooling module 90. In addition, since the gap between the heat dissipation base 30 and the cooling module 90 is kept, and the gap is surrounded by the elastic member 34, the melting heat dissipation members 33 sufficiently spread in the gap but do not spread beyond the gap. In addition, the heat dissipation members 33 do not make their surroundings dirty or reduce their volume. Thus, a reduction in the heat dissipation of the semiconductor module 10*c* is prevented, and a reduction in the reliability of the power converter 2 is thus prevented.

The melting heat dissipation members 33 are confined by the heat dissipation base 30, the cooling module 90, and the elastic member 34. When the melting heat dissipation members 33 continue to be heated, they may foam and emit gas. If the heat dissipation members 33 are confined by the heat dissipation base 30, cooling module 90, and elastic member 34, the gas is accumulated inside and may explode. To avoid this explosion, a plurality of cuts 34*a* are formed in the elastic member 34 of the heat dissipation base 30, as illustrated in FIG. 17. Each cut 34*a* communicates from the inside to the outside of the elastic member 34. Therefore, the gas emitted from the heat dissipation members 33 and confined by the heat dissipation base 30, cooling module 90, and elastic member 34 is output through the cuts 34*a* to the outside of the elastic member 34. Therefore, the gas is not accumulated in the space formed by the heat dissipation base 30, cooling module 90, and elastic member 34, which prevents the gas from exploding. The cuts 34*a* may be formed only to release the gas, and therefore may have a width different from that illustrated in FIG. 17 and may be formed at locations different from those illustrated in FIG. 17.

The disclosed technique makes it possible to prevent loosening of fastening to a cooling module, prevent a reduction in cooling performance, and prevent a reduction in the reliability of a semiconductor module and power converter.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor module, comprising:
- a semiconductor chip;
- an insulated circuit substrate including a wiring board on a front surface thereof, the wiring board having the semiconductor chip bonded thereto;
- a heat dissipation base having a front surface and a rear surface opposite to each other, the front surface having a substrate region to which the insulated circuit substrate is bonded, the rear surface having
  - a heat dissipation region overlapping the substrate region in a plan view of the semiconductor module and
  - a loop-shaped region surrounding the heat dissipation region,
- the heat dissipation base having a plurality of fastening holes through which fastening members are to be inserted, the fastening holes being located outside the substrate region and being surrounded by the loop-shaped region;
- a solid heat dissipation member made of a phase change material, provided on the rear surface of the heat dissipation base in the heat dissipation region; and
- an elastic member on the rear surface of the heat dissipation base in the loop-shaped region.

2. The semiconductor module according to claim 1, wherein the elastic member is made of silicone as a main component.

3. The semiconductor module according to claim 1, wherein the elastic member has a continuous loop shape.

4. The semiconductor module according to claim 1, wherein the elastic member is provided discontinuously along the loop-shaped region of the heat dissipation base.

5. The semiconductor module according to claim 4, wherein:

the heat dissipation base is rectangular in the plan view;

the loop-shaped region is provided along an outer periphery of the heat dissipation base; and the elastic member is provided in plurality, and the plurality of elastic members are respectively provided at four corners of the loop-shaped region.

6. The semiconductor module according to claim 4, wherein:

the heat dissipation base is rectangular in the plan view and has a pair of long sides and a pair of short sides;

the loop-shaped region is provided along an outer periphery of the heat dissipation base and has four linear regions respectively parallel to respective ones of the long sides and short sides; and the elastic member is provided in plurality and the plurality of elastic members are respectively provided along respective ones of the linear regions of the loop-shaped region.

7. The semiconductor module according to claim 4, wherein:

the heat dissipation base is rectangular in the plan view and has four sides;

the loop-shaped region is provided along an outer periphery of the heat dissipation base and has first to fourth linear regions respectively parallel to the four sides of the heat dissipation base; and the elastic member is provided in plurality, two of the plurality of elastic members are respectively provided at corners of the loop-shaped region located at opposite ends of the first linear region, and one of the plurality of elastic members is provided along the second linear region, which faces and is parallel to the first linear region.

8. The semiconductor module according to claim 1, wherein, measured from the rear surface of the heat dissipation base, a height of the elastic member is substantially equal to or is greater than a height of the heat dissipation member.

9. The semiconductor module according to claim 1, wherein the heat dissipation member is provided in plurality, and the plurality of heat dissipation members are provided in a matrix form in the heat dissipation region.

10. A power converter, comprising:

the semiconductor module according to claim 1; and a cooling module having a cooling surface that faces the rear surface of the heat dissipation base, the cooling surface and the rear surface of the heat dissipation base sandwiching the elastic member and the heat dissipation member therebetween in a state where the heat dissipation base is fastened to the cooling module by the fastening members being inserted through the fastening holes.

11. A power converter manufacturing method, comprising:

preparing the semiconductor module according to claim 1;

arranging a cooling surface of a cooling module to face the rear surface of the heat dissipation base so as to sandwich the elastic member and the heat dissipation member between the cooling surface and the rear surface of the heat dissipation base; and fastening the cooling module to the heat dissipation base by inserting fastening members through the fastening holes; and melting the heat dissipation member.

12. The power converter manufacturing method according to claim 11, wherein the melting of the heat dissipation member includes operating the semiconductor chip to generate heat, thereby melting the heat dissipation member.

* * * * *